United States Patent
Al-Shamma et al.

(10) Patent No.: US 10,170,162 B2
(45) Date of Patent: Jan. 1, 2019

(54) SENSE AMPLIFIER CALIBRATION

(71) Applicant: SanDisk Technologies LLC, Plano, TX (US)

(72) Inventors: Ali Al-Shamma, San Joe, CA (US); Tz-yi Liu, Palo Alto, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 15/602,889

(22) Filed: May 23, 2017

(65) Prior Publication Data
US 2018/0342273 A1    Nov. 29, 2018

(51) Int. Cl.
G11C 7/02 (2006.01)
G11C 7/22 (2006.01)
G11C 7/06 (2006.01)
G11C 7/10 (2006.01)

(52) U.S. Cl.
CPC .......... *G11C 7/02* (2013.01); *G11C 7/065* (2013.01); *G11C 7/10* (2013.01); *G11C 7/22* (2013.01)

(58) Field of Classification Search
CPC .......... G11C 7/22; G11C 7/10; G11C 7/065
See application file for complete search history.

(56) References Cited

U.S. PATENT DOCUMENTS

| | | | |
|---|---|---|---|
| 2002/0167838 A1* | 11/2002 | Perner | G11C 7/06 365/173 |
| 2003/0058685 A1* | 3/2003 | Tran | G11C 11/16 365/158 |
| 2004/0001364 A1* | 1/2004 | Bhatia | G11C 7/06 365/194 |
| 2005/0201148 A1 | 9/2005 | Chen et al. | |
| 2006/0262624 A1 | 11/2006 | Roohparvar | |
| 2008/0025074 A1 | 1/2008 | Arsovski | |
| 2008/0231342 A1 | 9/2008 | Tabaian et al. | |
| 2011/0122679 A1 | 5/2011 | Chen et al. | |
| 2012/0206973 A1 | 8/2012 | He et al. | |
| 2016/0133320 A1 | 5/2016 | Siau et al. | |
| 2016/0254048 A1 | 9/2016 | Siau et al. | |

* cited by examiner

*Primary Examiner* — Ajay Ojha
(74) *Attorney, Agent, or Firm* — Brinks Gilson & Lione

(57) ABSTRACT

A calibration circuit coupled to a sense amplifier circuit may be configured to determine a response time of the sense amplifier circuit relative to a pulse sequence. Based on the determined response time, the calibration circuit may be configured to set a level of a biasing current to a desired level in order to control the response time of the sense amplifier circuit.

20 Claims, 11 Drawing Sheets

SENSE AMPLIFIER CALIBRATION

BACKGROUND

Memory devices may include an array of memory cells that store data. The memory cells may be coupled to wordlines and bitlines. Sense circuitry may be electrically coupled to the array to read the data. In particular, the sense circuitry may be configured to sense current flowing through the bitlines. Based on the sensing, the sense circuitry may generate output signals indicative of the logic levels of the data being stored.

The sense circuitry may include a plurality of sense amplifier circuits. Each sense amplifier circuit may be coupled to a respective one of the bitlines, which in turn is coupled to a memory cell. A sense amplifier circuit may be configured to generate an output signal indicative of a logic level of the data stored in the memory cell to which it is coupled. Sense amplifier circuits coupled to multiple bitlines may be configured to operate simultaneously in order for data stored in multiple memory cells to be sensed simultaneously. To that end, it may be desirable for the sense amplifier circuits to output their respective output signals at the same time or as close to the same time as possible. However, due to inherent mismatches, such as mismatches in transistor oxide thicknesses, the sense amplifier circuits may output their respective output signals at different times. Thus, sense amplifier calibration processes that can calibrate sense amplifier circuits to output their respective output signals more closely in time may be desirable.

BRIEF DESCRIPTION OF THE DRAWINGS

The accompanying drawings, which are incorporated in and constitute a part of this specification illustrate various aspects of the invention and together with the description, serve to explain its principles. Wherever convenient, the same reference numbers will be used throughout the drawings to refer to the same or like elements.

DETAILED DESCRIPTION

Overview

Figure 1A:
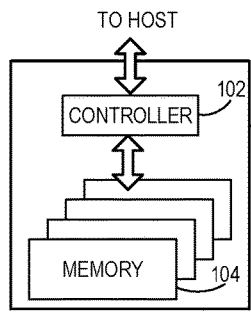
FIG. 1A is a block diagram of an example memory system.

By way of introduction, the below embodiments relate to memory systems and related devices, apparatuses, and methods for calibrating sense amplifier circuitry. In one embodiment, a circuit includes a calibration controller and a sense amplifier operation controller. The calibration controller is configured to generate configuration data based on a response time of a sense amplifier circuit. The sense amplifier operation controller is configured to set a conditioning level of a conditioning current for the sense amplifier circuit according to the configuration data.

In some embodiments, the configuration data indicates an amount to adjust the conditioning current from an initial conditioning level.

In some embodiments, the calibration controller is further configured to measure a timing relationship between the response time and a pulse sequence, and generate the configuration data according to the timing relationship.

In some embodiments, the calibration controller is configured to determine when the sense amplifier circuit resolves relative to the pulse sequence to measure the timing relationship.

In some embodiments, the circuit further includes a pulse generator configured to supply the pulse sequence to a detection circuit, and the calibration controller circuit is configured to measure a level of an output signal of the detection circuit to determine when the sense amplifier resolves relative to one or more pulses of the pulses sequence.

In some embodiments, the circuit further includes a pulse generator configured to supply the pulse sequence within a single calibration window, and the calibration controller is configured to determine the timing relationship between the response time and the pulse sequence within the single calibration window.

In some embodiments, the pulse sequence includes a plurality of pulses, and the circuit further includes a pulse generator configured to supply a respective one of the plurality of pulses in each of a plurality of calibration windows. The calibration controller is configured to determine whether the sense amplifier resolves during each of the plurality of calibration windows.

In some embodiments, the calibration controller is configured to determine whether to adjust the conditioning level after each of the plurality of calibration windows, and wherein each determination of whether to adjust is based on whether the calibration controller determined that the sense amplifier resolved during a prior one of the plurality of calibration windows.

In some embodiments, the calibration controller is configured to determine whether to adjust the conditioning current by different conditioning amounts. Each conditioning amount is associated with a respective one of the calibration windows.

In some embodiments, for each of the plurality of calibration windows, the pulse generator is configured to supply a pulse in a respective calibration window upon expiration of a respective one of a plurality of time periods, where the time periods are increasingly shorter over consecutive calibration windows.

In another embodiment, a circuit includes a calibration controller configure to: determine a response time characterization of a sense amplifier circuit relative to a pulse sequence; in response to the measurement, determine an amount to adjust an initial conditioning level of a cell current in order for the sense amplifier circuit to have a desired response time; and store configuration data that indicates the amount to adjust.

In some embodiments, the circuit includes a sense amplifier operation controller configured to access the configuration data; and configure a bitline conditioning circuit to generate the cell current at a conditioning level corresponding to the configuration data.

In some embodiments, the circuit includes a pulse generator configured to supply the pulse sequence to a detection circuit, and the calibration controller is configured to determine a level of an output signal of the detection circuit to determine the response time characterization.

In some embodiments, the circuit includes a pulse generator configured to supply the pulse sequence within a single calibration window, and the calibration controller is configured to generate the configuration data according to a measured timing relationship between an uncalibrated response time of the sense amplifier circuit and the pulse sequence within the single calibration window.

In some embodiments, the pulse sequence includes a plurality of pulses, and a pulse generator is configured to supply a respective one of the plurality of pulses in each of a plurality of calibration windows. The calibration controller is configured to determine whether the sense amplifier circuit resolves during each of the plurality of calibration windows.

In some embodiments, the calibration controller is configured to determine whether to adjust the conditioning level after each of the plurality of calibration windows. Each determination of whether to adjust is based on whether the calibration controller determined that the sense amplifier circuit resolved during a prior one of the plurality of calibration windows.

In some embodiments, the calibration controller is configured to adjust a conditioning level of the cell current multiple times before generating the configuration data.

In another embodiment, a system includes a sense amplifier circuit, a pulse generator, a response time detection circuit, a calibration controller, and a sense amplifier operation controller. The sense amplifier circuit is configured to resolve a logic level of data stored in a memory cell. The pulse generator is configured to supply a pulse sequence. The response time detection circuit is configured to output a resolve signal indicative of whether the sense amplifier resolves the logic level in response to receipt of the pulse sequence. The calibration controller is configured to measure when the sense amplifier circuit resolves relative to the pulse sequence, and generate configuration data based on the measurement. The sense amplifier operation controller is configured to set a bitline conditioning circuit according to the configuration data.

In some embodiments, the detection circuit includes a pair of transistor branches configured to receive the output of the sense amplifier and the pulse sequence, and a latch circuit configured to generate the resolve signal.

In some embodiments, a transistor in each of the pair of transistor branches is configured to receive the pulse sequence.

Other embodiments are possible, and each of the embodiments can be used alone or together in combination. Accordingly, various embodiments will now be described with reference to the attached drawings.

EMBODIMENTS

The following embodiments describe memory systems and related devices, apparatuses, and methods for calibrating sense amplifier circuitry. Before turning to these and other embodiments, the following paragraphs provide a discussion of exemplary memory systems and storage devices that can be used with these embodiments. Of course, these are just examples, and other suitable types of memory systems and/or storage devices can be used.

FIG. 1A is a block diagram illustrating a memory system 100. The memory system 100 may include a controller 102 and memory that may be made up of one or more memory dies 104. As used herein, the term die refers to the set of memory cells, and associated circuitry for managing the physical operation of those memory cells, that are formed on a single semiconductor substrate. The controller 102 may interface with a host system and transmit command sequences for read, program, and erase operations to the memory die(s) 104.

The controller 102 may include and/or take the form of processing circuitry, a microprocessor or processor, and a computer-readable medium that stores computer-readable program code (e.g., software or firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" can mean directly in communication with or indirectly (wired or wireless) in communication with through one or more components, which may or may not be shown or described herein.

As used herein, a memory controller or simply controller 102 is a device that manages data stored in memory and communicates with a host, such as a computer or electronic device. A memory controller 102 can have various functionality in addition to the specific functionality described herein. For example, the memory controller 102 can format the memory to ensure the memory is operating properly, map out bad memory cells, and allocate spare cells to be substituted for future failed cells. Some part of the spare cells can be used to hold firmware to operate the memory controller 102 and implement other features. In operation, when a host needs to read data from or write data to the memory, it will communicate with the memory controller 102. If the host provides a logical address to which data is to be read/written, the memory controller 102 can convert the logical address received from the host to a physical address in the memory. (Alternatively, the host can provide the physical address). The memory controller 102 can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between the controller 102 and the memory die(s) 104 may be any suitable interface, such as Toggle Mode 200, 400, or 800 (or higher). In some example embodiments, the memory system 100 may be a card based system, such as a secure digital (SD) or a micro secure digital (micro-SD) card. In other example embodiments, the system 100 may be part of an embedded memory system. In addition or alternatively, the memory system 100 may be or included in a device or apparatus.

Although in the example illustrated in FIG. 1A, the memory system 100 may include a single channel between the controller 102 and the memory die(s) 104, the subject matter described herein is not limited to having a single memory channel. For example, in some memory system architectures, 2, 4, 8 or more channels configured in parallel may exist between the controller 102 and the memory die(s) 104, depending on controller capabilities. For example, in a multi-die configuration of the memory system 100, the controller 102 may be configured to communicate with one die or one group of dies using one channel and communicate with another die or another group of dies using a different channel. In any of the embodiments described herein, more than a single channel may exist between the controller 102 and the memory die(s)s 104, even if a single channel is shown in the drawings.

Figure 1B:
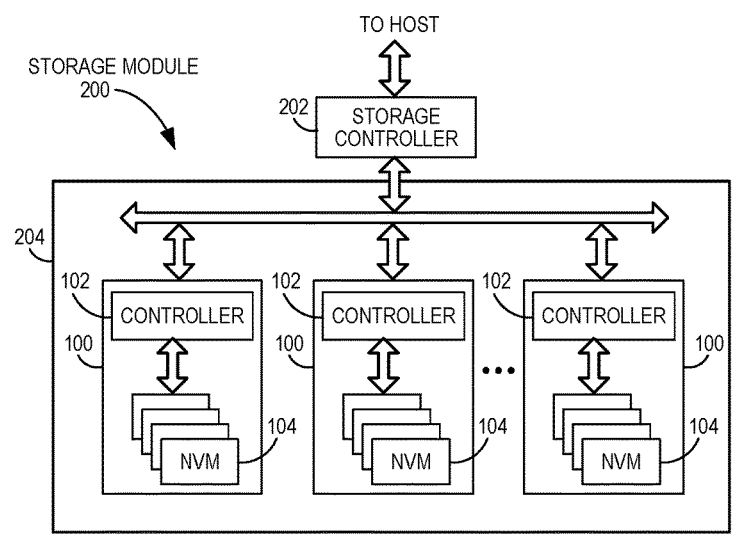
FIG. 1B is a block diagram of a storage module that includes a plurality of memory systems.

FIG. 1B illustrates a storage module 200 that includes plural memory systems 100. As such, the storage module 200 may include a storage controller 202 that interfaces with a host and with a storage system 204, which includes a plurality of memory systems 100. The interface between the storage controller 202 and memory systems 100 may be a bus interface, such as a serial advanced technology attachment (SATA), a peripheral component interface express (PCIe) interface, an embedded MultiMediaCard (eMMC) interface, a SD interface, or a Universal Serial Bus (USB) interface, as examples. The storage system 200, in one embodiment, may be a solid state drive (SSD), such as found in portable computing devices, such as laptop computers and tablet computers, and mobile phones.

Figure 1C:
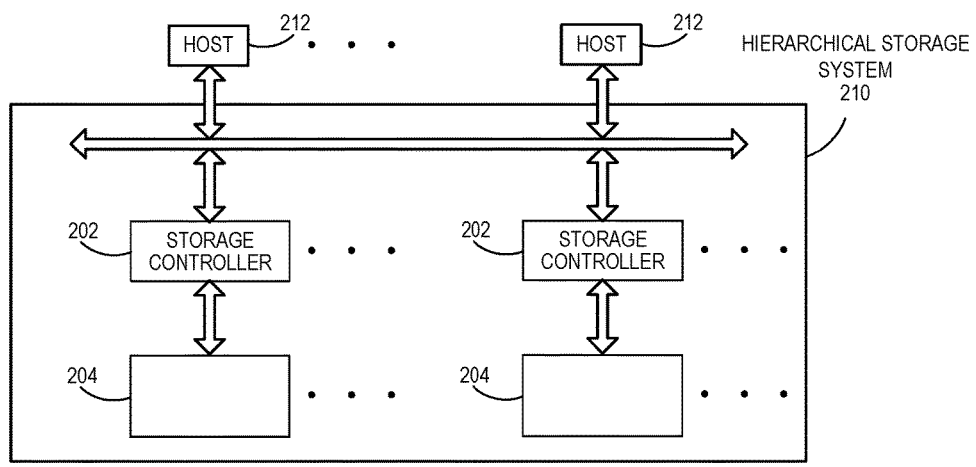
FIG. 1C is a block diagram of a hierarchical storage system.

FIG. 1C is a block diagram illustrating a hierarchical storage system 210. The hierarchical storage system 210 may include a plurality of storage controllers 202, each of which control a respective storage system 204. Host systems 212 may access memories within the hierarchical storage system 210 via a bus interface. Example bus interfaces may include a non-volatile memory express (NVMe), a fiber channel over Ethernet (FCoE) interface, an SD interface, a USB interface, a SATA interface, a PCIe interface, or an eMMC interface as examples. In one embodiment, the storage system 210 illustrated in FIG. 1C may be a rack mountable mass storage system that is accessible by multiple host computers, such as would be found in a data center or other location where mass storage is needed.

Figure 2A:
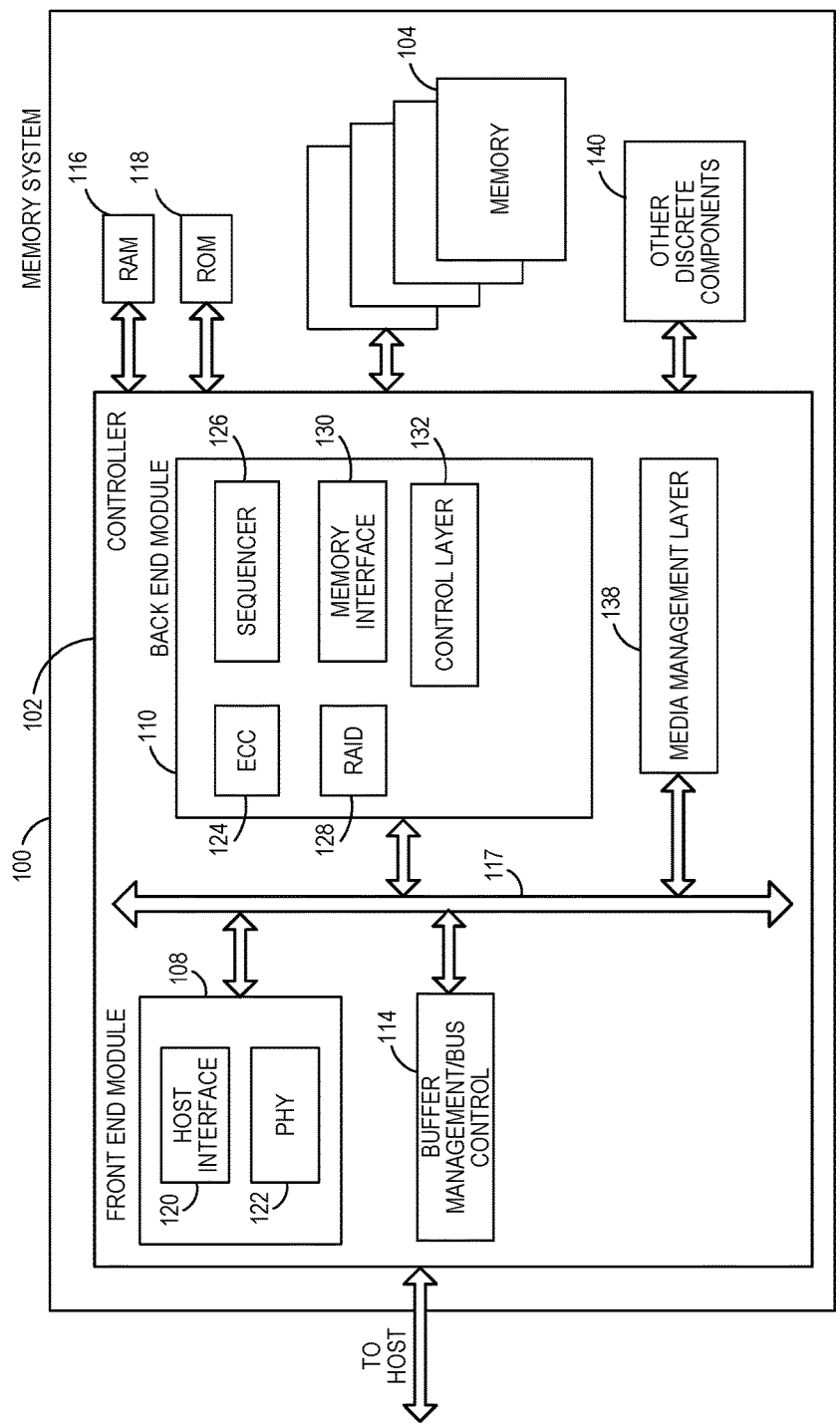
FIG. 2A is a block diagram of exemplary components of a controller of the memory system of FIG. 1A.

FIG. 2A is a block diagram illustrating exemplary components of the controller 102 in more detail. The controller 102 may include a front end module 108 that interfaces with a host, a back end module 110 that interfaces with the memory die(s) 104, and various other modules that perform various functions of the memory system 100. In general, a module may be hardware or a combination of hardware and software. For example, each module may include an application specific integrated circuit (ASIC), a field programmable gate array (FPGA), a circuit, a digital logic circuit, an analog circuit, a combination of discrete circuits, gates, or any other type of hardware or combination thereof. In addition or alternatively, each module may include memory hardware that comprises instructions executable with a processor or processor circuitry to implement one or more of the features of the module. When any one of the module includes the portion of the memory that comprises instructions executable with the processor, the module may or may not include the processor. In some examples, each module may just be the portion of the memory that comprises instructions executable with the processor to implement the features of the corresponding module without the module including any other hardware. Because each module includes at least some hardware even when the included hardware comprises software, each module may be interchangeably referred to as a hardware module.

The controller 102 may include a buffer manager/bus controller module 114 that manages buffers in random access memory (RAM) 116 and controls the internal bus arbitration for communication on an internal communications bus 117 of the controller 102. A read only memory (ROM) 118 may store and/or access system boot code. Although illustrated in FIG. 2A as located separately from the controller 102, in other embodiments one or both of the RAM 116 and the ROM 118 may be located within the controller 102. In yet other embodiments, portions of RAM 116 and ROM 118 may be located both within the controller 102 and outside the controller 102. Further, in some implementations, the controller 102, the RAM 116, and the ROM 118 may be located on separate semiconductor dies.

Additionally, the front end module 108 may include a host interface 120 and a physical layer interface (PHY) 122 that provide the electrical interface with the host or a next-level storage controller. The choice of the type of the host interface 120 may depend on the type of memory being used. Example types of the host interface 120 may include, but are not limited to, SATA, SATA Express, SAS, Fibre Channel, USB, PCIe, and NVMe. The host interface 120 may typically facilitate transfer for data, control signals, and timing signals.

The back end module 110 may include an error correction code (ECC) engine or module 124 that encodes the data bytes received from the host, and decodes and error corrects the data bytes read from the memory dies 104. The back end module 110 may also include a command sequencer 126 that generates command sequences, such as program, read, and erase command sequences, to be transmitted to the memory die(s) 104. Additionally, the back end module 110 may include a RAID (Redundant Array of Independent Drives) module 128 that manages generation of RAID parity and recovery of failed data. The RAID parity may be used as an additional level of integrity protection for the data being written into the memory system 100. In some cases, the RAID module 128 may be a part of the ECC engine 124. A memory interface 130 may be configured to provide the command sequences to the memory die(s) 104 and receives status information from the memory die(s) 104. Along with the command sequences and status information, data to be programmed into and read from the memory die(s) 104 may be communicated through the memory interface 130. In one embodiment, the memory interface 130 may be a double data rate (DDR) interface, such as a Toggle Mode 200, 400, or 800 (or higher) interface. A control layer 132 may control the overall operation of back end module 110.

Additionally, the controller 102 may include a media management layer 138 configured to perform address management, wear leveling of memory cells of the memory die(s) 104, and other memory management operations, such as folding operations for example.

The memory system 100 may also include other discrete components 140, such as external electrical interfaces, external RAM, resistors, capacitors, or other components that may interface with controller 102. In other embodiments, one or more of the RAID module 128, media management layer 138 and buffer management/bus controller 114 are optional components that may not be necessary in the controller 102.

Figure 2B:
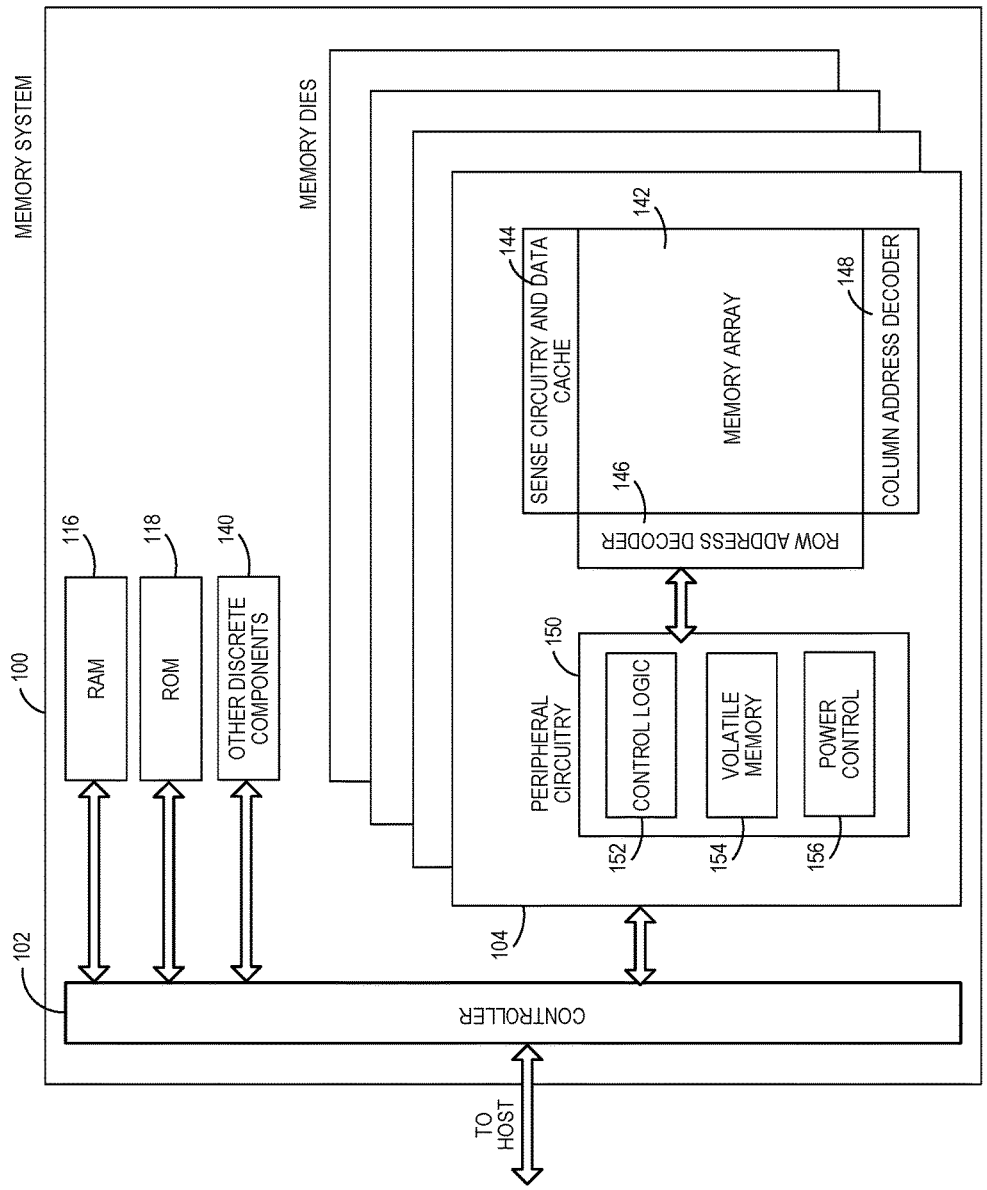
FIG. 2B is a block diagram of exemplary components of a memory die of the non-volatile memory system of FIG. 1A.

FIG. 2B is a block diagram illustrating exemplary components of a memory die 104 in more detail. The memory die 104 may include a memory array 142. The memory array 142 may include a plurality of memory elements or cells, each configured to store one or more bits of data. The non-volatile memory elements or cells may be any suitable volatile memory cells, non-volatile memory cells, or a combination thereof. In one example, the memory cells may be resistive memory cells, although other types of memory cells may be possible. Example types of memory for the non-volatile and volatile memory are provided below.

The memory cells may be disposed in the memory array 142 in accordance with a matrix-like structure of rows and columns of memory cells. At the intersection of a row and a column is a memory cell. A column of memory cells may be referred to as a string. Memory cells in a string or column may be electrically connected in series. A row of memory cells may be referred to as a storage page.

The memory array 142 may also include wordlines and bitlines connected to the memory cells. Each storage page of memory cells is coupled to a wordline. In addition, each string of memory cells may be coupled to a bitline. Further, a single string may span across multiple wordlines, and the number of memory cells in a string may be equal to the number of storage pages in a block.

The non-volatile memory die 104 may further include sense circuitry and data cache 144 that is configured to sense data in the array and cache data that is sensed from and/or that is to be programmed into the memory array 142. The sense circuitry and data cache 144 may further include calibration circuitry that is configured to calibrate the sense circuitry. The sense circuitry and its associated calibration circuitry is described in further detail below. The memory die 104 may also include a row address decoder 146 and a column address decoder 148. The row address decoder 146 may decode a row address and select a particular wordline in the memory array 142 when reading or writing data to/from the memory cells in the memory array 142. The column address decoder 148 may decode a column address to select a particular group of bitlines in the memory array 142 to be electrically coupled to the data cache 144.

In addition, the memory die 104 may include peripheral circuitry 150. The peripheral circuitry 150 may include control logic circuitry 152, which may include and/or operate as a state machine, and that is configured to provide status information to the controller 102 as well as provide chip-level or die-level control of memory operations. The peripheral circuitry 150 may also include volatile memory 154. An example configuration of the volatile memory 154 may include latches, although other configurations are possible.

In addition, the peripheral circuitry 150 may include power control circuitry 156 that is configured to generate and supply voltages to the memory array 142, including voltages (such as in the form of voltage pulses) to the wordlines, erase voltages (such as in the form of erase voltage pulses), the source select gate bias voltage $V_{SSG}$ to the source select gate bias line SSG, the drain select gate bias voltage $V_{DSG}$ to the drain select gate bias line DSG, as well as other voltages that may be supplied to the memory array 142. For example, the power control circuitry 156 may be configured to supply calibration pulses to the calibration circuitry of the sense circuitry, as described in further detail below. In one example configuration, the power control circuitry may include charge pumps to generate the voltages, although other configurations may be possible.

Figure 3:
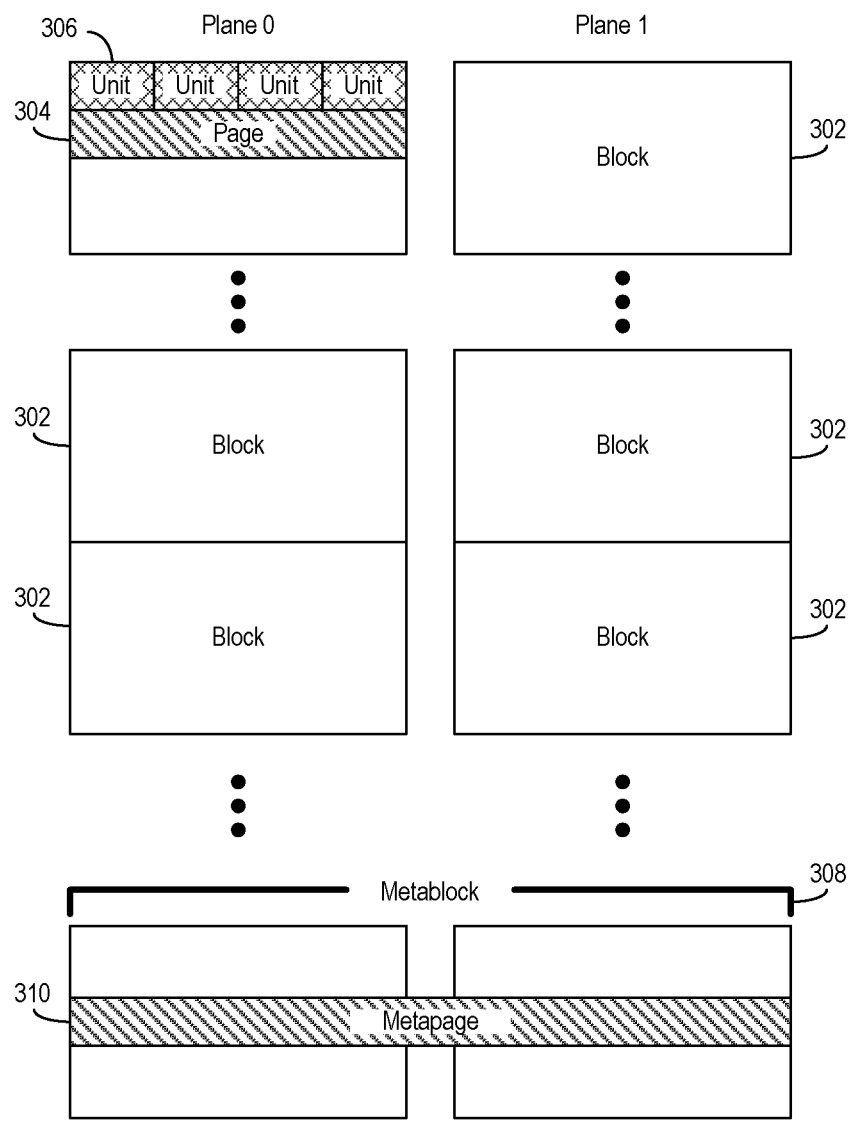
FIG. 3 is a block diagram of an example organizational arrangement or hierarchy of a memory array for memory.

Referring to FIG. 3, the memory array 142 and/or a plurality of memory arrays 142 spanning multiple memory dies 104 may have an organizational arrangement or hierarchy under which memory elements or cells of the memory array 142 and/or multiple memory arrays 142 of multiple memory dies 104 may be organized. The controller 102 may be configured to store and access data in accordance with the organizational arrangement or hierarchy.

FIG. 3 is a block diagram of an example organizational arrangement or hierarchy of a memory array 142. As mentioned, the memory cells may be divided or organized into blocks 302, and each block 302 may further be divided into a number of pages 304. Each block 302 may contain the minimum number of memory elements that may be erased together. In addition, each page 304 may be a unit of sensing in the memory array 142. Each individual page 304 may further be divided into segments or units 306, with each segment or unit 306 containing the fewest number of memory cells that may be written to at one time as a basic programming operation. Data stored in a segment or unit of memory cells—referred to as a flash memory unit (FMU), an ECC page, or a codeword—may contain the amount of data that is written at one time during a basic programming operation and/or the amount of data that can be encoded or decoded by the ECC engine 124 during a single encoding or decoding operation. The pages 304 may be divided into the same number of segments or units. Example numbers of segments or unit may be four or eight, although other numbers are possible. In general, data may be stored in blocks and pages of memory elements non-contiguously (randomly) or contiguously.

In addition, the organizational arrangement or hierarchy may include one or more planes in which each of the blocks 302 may be configured. Generally, a plane includes a "column" of blocks 302, although other configurations may be possible. A single memory array 142 may include a single plane or multiple planes. The example arrangement shown in FIG. 3 includes two planes, Plane 0 and Plane 1. Data stored in different planes may be sensed simultaneously or independently.

Additionally, the organizational arrangement or hierarchy may include metablocks 308 and metapages 310. A metablock address or number identifying a metablock may be mapped to and/or correspond to a logical address (e.g., a logical group number) provided by a host. A metablock 308 and a metapage 310 may span or be distributed across a respective single block and page in a single plane, or alternatively, may span or be distributed across respective multiple blocks and multiple pages across multiple planes. FIG. 3 shows the metablock 308 and the metapage 310 spanning across two planes, Plane 0 and Plane 1. Depending on the organizational arrangement, metablocks 308 and metapages 310 spanning across multiple planes may span across only those planes of a single memory die 104, or alternatively may span across multiple planes located of multiple memory dies 104.

Figure 4:
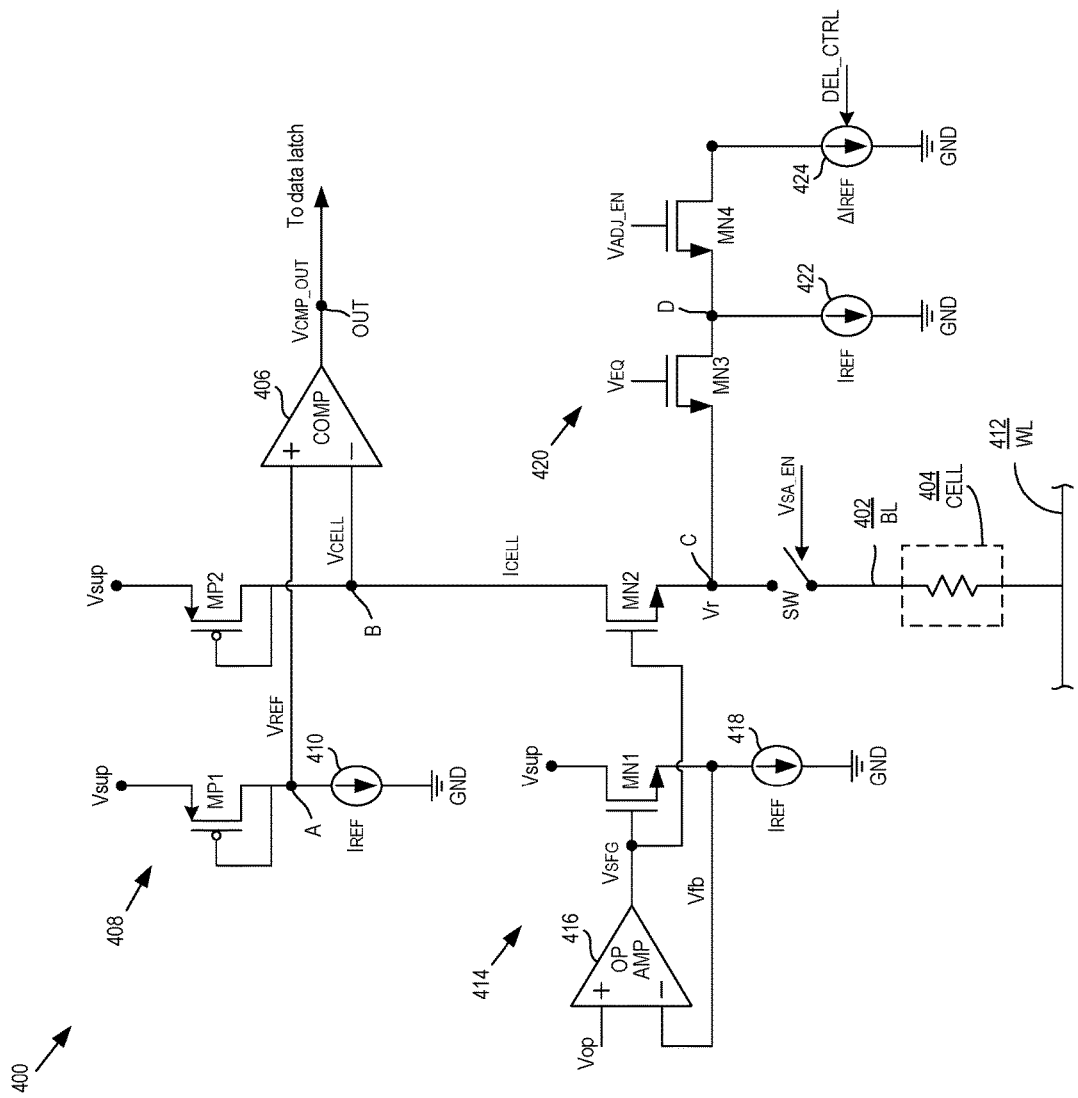
FIG. 4 is a circuit schematic diagram of an example sense amplifier circuit.

FIG. 4 shows a circuit schematic diagram of an example sense amplifier circuit 400 of the sense circuitry and data cache 144. The sense amplifier circuit 400 may be coupled to a bitline 402 of the memory array 142, which in turn is coupled to an associated memory cell 404. The memory cell may be a two-terminal cell, such as a resistive cell as indicated by the resistor symbol in FIG. 4. The memory cell 404 may be configured in one of two states, an on-state and an off-state. When the memory cell 404 is in the on-state, the memory cell 404 may be configured and/or referred to as an on-cell. Alternatively, when the memory cell 404 is in the off-state, the memory cell 404 may be configured and/or referred to as an off-cell. A logic level, alternatively referred to as a logic value, may be a logic 1 level or value or a logic 0 level or value. The state of the memory cell 404 may correspond to the logic level of the data that the memory cell 404 is storing. That is, the memory cell 404 may be programmed into the on-state to be an on-cell or into the off-state to be an off-cell. The memory cell 404 may be programmed to be in the on-state to store a data bit having a logic 0 value, or may be programmed to be in the off-state to store a data bit having a logic 1 value.

For example configuration where the memory cell 404 is a resistive memory cell, the memory cell 404 may be programmed to have a certain resistance level or value, including a high resistance level or value and a low resistance level or value. In general, the high resistance may be a resistance level or value that is higher than the low resistance level or value, and the low resistance value may be a resistance level or value that is lower than the high resistance level or value. The high and low resistance levels may be such that the memory cell 404 may be configured to generate different current amounts when exhibiting the different resistance level, where the different current amounts can be differentiated by the sense amplifier circuit 400 to determine whether the memory cell is in the on-state or the off-state. In particular, when the memory cell 404 is programmed to have the low resistance level, the memory cell 404 may be configured to conduct an amount of current that is higher than the amount of current the memory cell 404 is configured to conduct when programmed to have the high resistance level. In general, when the memory cell 404 is programmed to have the low resistance level, the memory cell 404 may be configured to draw a first amount of current that indicates that the memory cell 404 is in the on-state or is an on-cell and is storing a data bit having the logic 0 level. Otherwise stated, when the memory cell 404 is programmed to store a data bit having a logic 0 level, the memory cell 404 may be programmed to have the low resistance level. Alternatively, when the memory cell 404 is programmed to have the high resistance level, the memory cell 404 may be configured to draw a second amount of current lower than the first amount of current that indicates that the memory cell 404 is in the off-state or is an off cell and is storing a logic 1 value. As used herein, a first amount of current that indicates that the memory cell 404 is in the on-state may be referred to as the on-cell current amount, and a second amount of current that indicates that the memory cell is in the off-state may be referred to as the off-cell current amount. In addition, for resistive memory cells, both the on-cell current and the off-cell current may be non-zero values. As a non-limiting example, when the memory cell 404 is programmed to be an on-cell, the memory cell 404 may have the first resistance level to be configured to draw an on-cell current amount of 140 nanoamps (nA), and when the memory cell 404 is programmed to be an off-cell, the memory cell 404 may have the second resistance level to be configured to draw an off-cell current amount of 40 nA.

The sense amplifier circuit 400 may be configured to sense the amount of current being drawn through the bitline 502 to the memory cell 404 to identify whether the memory cell 404 is programmed as an on-cell or an off-cell, and in turn, whether the memory cell 404 is storing a data bit having a logic 0 level or a logic 1 level. In further detail, the sense amplifier circuit 400 may include a comparator circuit (COMP) 406 that is configured to compare a cell current $I_{CELL}$ being drawn through the bitline 402 to the memory cell 404 with a reference current $I_{REF}$ to determine whether the memory cell 404 is storing a data bit having a logic 0 level or a logic 1 level. Based on the comparison, the comparator circuit 406 may be configured to generate an output signal $V_{OUT}$, such as a voltage output signal, at an output node OUT that indicates whether the memory cell 404 is storing a data bit having a logic 0 level or a logic 1 level. In particular, if the amount of the cell current $I_{CELL}$ is greater than the amount of the reference current $I_{REF}$, the comparator circuit 406 may be configured to generate its output signal $V_{OUT}$ at a low voltage level, which may indicate that the memory cell 404 is in the on-state and storing a data bit having a logic 0 value. Alternatively, if the cell current $I_{CELL}$ is lower than the reference current $I_{REF}$, the comparator circuit 406 may be configured to generate its output signal $V_{OUT}$ at a high voltage level, which may indicate that the memory cell 404 is in the off-state and storing a data bit having a logic 1 value.

The reference current $I_{REF}$ may be an amount of current that is in between the on-cell current amount of the cell current $I_{CELL}$ and the off-cell current amount of the cell current $I_{CELL}$. In particular example configurations, the reference current $I_{REF}$ may be halfway or a middle value of the on-cell and off-cell amounts of current. To illustrate, for an example configuration where the on-cell current amount is 140 nA and the off-cell current amount is 40 nA, the reference current $I_{REF}$ may be 90 nA.

As indicated in FIG. 4, the output signal $V_{OUT}$ may then be provided to a latch circuit (not shown) that is configured to store the output signal $V_{OUT}$ at the voltage level output by the comparator circuit 406. If the sense amplifier circuit 400 is operating in response to a host read command, the voltage stored in the latch may be sent external to the memory die 104 on which the sense circuitry and data cache 144 is configured. The voltage level, which may correspond to a logic level of a bit of a larger data set, may be sent to the RAM 116, for example. The data set may be subjected to an error correction and detection process and thereafter sent to the host device that issued the host read command. Other reasons or purposes for the sense amplifier circuit 400 to generate and output its output signal $V_{OUT}$ at a level indicative of the logic level of the data bit that the memory cell 404 is storing may be possible.

The sense amplifier circuit 400 may further include a comparator input circuit 408 configured to generate and provide the input signals for the comparator circuit 406. In particular, the comparator input circuit 408 may be configured to generate a reference voltage $V_{REF}$ at a node A and a cell voltage $V_{CELL}$ at a node B. The reference voltage $V_{REF}$ may be generated at a voltage level corresponding to the amount of the reference current $I_{REF}$. Similarly, the cell voltage $V_{CELL}$ may be generated at a voltage level corresponding to the amount of the cell current $I_{CELL}$. Accordingly, if the cell current $I_{CELL}$ is greater than the reference current $I_{REF}$, then the voltage level of the cell voltage $V_{CELL}$ may be greater than the voltage level of the reference voltage $V_{REF}$. Alternatively, if the cell current $I_{CELL}$ is lower than the reference current $I_{REF}$, then the voltage level of the cell voltage $V_{CELL}$ may be lower than the voltage level of the reference voltage $V_{REF}$.

The example configuration of the comparator input circuit 408 shown in FIG. 4 may include a pair of diode-connected p-channel metal-oxide-semiconductor field-effect transistors (PMOS transistors) MP1 and MP2. The first PMOS transistor MP1 may have its source terminal connected or tied to a power supply voltage Vsup, and may have its gate and drain terminals tied or connected together at node A where the reference voltage $V_{REF}$ is generated. In addition, the comparator input circuit 408 may include a first current source 410 configured to generate the reference current $I_{REF}$. As used herein, the reference current $I_{REF}$ is considered to be a current that flows at a reference amount or reference level. Accordingly, a current source generating the reference current $I_{REF}$ and a current source generating a current at a reference amount may mean the same. Also, two different current sources described as both generating the reference current $I_{REF}$ may mean the same as the two different current sources generating two separate currents but both at the same reference amount or level. As shown in FIG. 4, the first current source 410 may have a first end connected to node A and a second end connected to a ground reference GND. Also, node A may be tied to a positive input terminal of the comparator circuit 406 such that the reference voltage $V_{REF}$ is supplied to the positive input terminal.

In addition, the second PMOS transistor may have its source terminal connected or tied to the power supply voltage Vsup, and may have its gate and drain terminals tied or connected together at node B where the cell voltage $V_{CELL}$ is generated. As shown in FIG. 4, node B may be tied to a negative input terminal of the comparator circuit 406 such that the reference voltage $V_{REF}$ is supplied to the negative input terminal.

The sense amplifier circuit 400, and in particular the comparator circuit 406, may be configured to generate the output signal $V_{OUT}$ to indicate the logic level of the data bit stored in the memory cell 404 in response to subjecting the memory cell 404 to a read voltage Vr generated at a read voltage level. For some example configurations, the read voltage level may be 2.7 volts (V), although other read voltage levels maybe possible. During a sense operation, the wordline (WL) 412 coupled to the memory cell may also be set to a wordline voltage at a certain, predetermined level, which may be 0 V for some example configurations.

The sense amplifier circuit 400 may further include a read voltage generation circuit 414 that is configured to generate the read voltage Vr at the read voltage level at a node C. As shown in FIG. 4, the read voltage generation circuit 414 may include an operational amplifier circuit (OP AMP) 416, a first n-channel metal-oxide-semiconductor field-effect transistor (NMOS transistor) MN1, a second NMOS transistor MN2, and a second current source 418. Node C where the read voltage Vr is generated may be tied to the source terminal of the second NMOS transistor MN2. The operational amplifier circuit 416 may be configured to generate an op-amp output voltage $V_{SFG}$ and supply the op-amp output voltage to each of the gate terminals of the first and second NMOS transistors MN1, MN2. The operational amplifier circuit 416 may be configured to generate the op-amp output voltage $V_{SFG}$ at a level that is the sum of the read voltage level and the threshold voltage level of the first and second NMOS transistors MN1, MN2. This way, the read voltage generated at node C (and the source terminal of the second NMOS transistor MN2) may be at the read voltage level.

In addition, the operational amplifier circuit 416 may be configured to receive at its positive input terminal an op amp input voltage Vop at the read voltage level. The op amp input voltage Vop may be provided from a voltage source external the sense amplifier circuit 400, such as the power control circuit 156 (FIG. 2B), for example. Also, the operational amplifier circuit 416 may be configured to receive at its negative input terminal a feedback voltage Vfb generated at the source terminal of the first NMOS transistor MN2. The second current source 418 may be configured to generate the reference current $I_{REF}$, and as shown in FIG. 4, may be coupled to the source terminal of the first NMOS transistor MN1, which may cause the feedback voltage Vfb to be generated at the read voltage level in a regulated manner, which in turn may allow the read voltage generation circuit 414 to accurately generate the read voltage Vr at the read voltage level at node C. Also, as shown in FIG. 4, the second NMOS transistor MN2 may be in the current path through which the cell current $I_{CELL}$ flows, with the drain terminal of the second NMOS transistor MN2 coupled to node B where the cell voltage $V_{CELL}$ is generated.

The sense amplifier circuit 400 may also include a switching circuit SW coupled to the bitline 402 and in the current path through which the cell current $I_{CELL}$ flows. When the switch SW is turned on or closed, the cell current $I_{CELL}$ may be permitted to flow through the bitline 402 to the memory cell 404. Alternatively, when the switch SW is turned off or open, the switch SW may create an open circuit such that the cell current $I_{CELL}$ is not permitted to flow through the bitline 402 to the memory cell 404.

The switch SW may be controlled by a sense amp control or enable signal $V_{SA\_EN}$. In particular, the sense amp enable signal $V_{SA\_EN}$ may be generated at a first level to turn on (close) the switch SW and at a second level to turn off (open) the switch SW. The sense amp enable signal $V_{SA\_EN}$ may be generated by the control logic circuit 152 and/or the power control circuit 156 (FIG. 2B). When the control logic circuit 152 wants or determines to have the sense amplifier circuit 400 to perform a sense operation, it may transition the sense amp enable signal $V_{SA\_EN}$ from the second level to the first level to switch the switch SW from the being open to being closed. In response, the cell current $I_{CELL}$ may begin flowing through the bitline 402 and the memory cell 404. The amount of the cell current $I_{CELL}$ may depend on whether the memory cell 404 is programmed as an on cell or as an off cell, as previously described. The flow of the cell current $I_{CELL}$ may generate the cell voltage $V_{CELL}$ at a level dependent on the amount of the cell current $I_{CELL}$. In response, the comparator circuit 406 may generate its output signal $V_{CMP\_OUT}$ at a voltage level indicative of whether the cell voltage $V_{CELL}$ is higher or lower than the reference voltage $V_{REF}$ (or whether the cell current $I_{CELL}$ is higher or lower than the reference current $I_{REF}$).

As previously described, if the memory cell 404 is programmed as an on-cell and is storing a data bit having a logic 0 level, then the cell current $I_{CELL}$ may be greater than the reference current $I_{REF}$, and the comparator circuit 406 may generate the output voltage $V_{CMP\_OUT}$ at a low voltage level to indicate the logic 0 level being stored. Alternatively, if the memory cell 404 is programmed as an off-cell and is storing at data bit having a logic 1 level, then the cell current $I_{CELL}$ may be less than the reference current $I_{REF}$, and the comparator circuit 406 may generate the output voltage $V_{CMP\_OUT}$ at a high voltage level to indicate the logic 1 level being stored.

Due to inherent delays in the sense amplifier circuit 400, the comparator circuit 406 may not output its output signal $V_{CMP\_OUT}$ at a voltage level indicating the logic level of the data that the memory cell 404 is storing at the very instant that the switch SW closes. Instead, some amount of time may elapse from the time that the switch SW closes for the comparator circuit 406 to resolve, or determine, the logic level of the data stored in the memory cell 404. Once the comparator circuit 406 has resolved what the logic level is, the comparator circuit 406 may output its output signal $V_{CMP\_OUT}$ at the voltage level corresponding to the logic level. As used herein, the response time of the sense amplifier circuit 400 (or alternatively referred to as the resolve time) may be a time period extending from the time that the switch SW closes and the cell current $I_{CELL}$ starts flowing through the bitline 402 to the memory cell 404 to a time when the comparator circuit 406 resolves the logic level of the data stored in the memory cell and outputs the output signal $V_{CMP\_OUT}$ at a level indicative of the logic level.

Response time (or resolve time) may also, or alternatively, be viewed from the perspective of the program state of the memory cell 404. That is, the response time or resolve time of the sense amplifier circuit 400 may be the time period extending from the time that the switch SW closes to the time that the comparator circuit 406 resolves that the memory cell 404 is programmed as an on-cell or as an off-cell.

Also, for some example configurations, the sense amplifier circuit 400 may multiple or different response times depending on the logic level of the data stored in the memory cell 404. For example, the sense amplifier circuit 400 may have a first response time when the memory cell 404 is programmed as an on-cell and is storing data having a logic 0 level, and may have a second response time when the memory cell 404 is programmed as an off-cell and is storing a logic 1 level.

Such a situation where the sense amplifier circuit 400 may occur where the sense amplifier circuit 400 is configured to initially output its output signal $V_{CMP\_OUT}$ at a first voltage level that indicates one of the logic levels. If that first voltage level does in fact correspond to the logic level of the data actually being stored, then the comparator circuit 406 may maintain its output signal $V_{CMP\_OUT}$ at the first voltage level when it resolves that the memory cell 404 is storing data having a logic level corresponding to the first voltage level. However, if the logic level of the data being stored in the memory cell 404 corresponds to a second voltage level that is different than the first voltage level that the comparator circuit 406 initially outputs, the comparator circuit 406 may be configured to transition its output signal $V_{CMP\_OUT}$ from the first voltage level to the second voltage level to indicate the other logic level. The time that the comparator circuit 406 transitions its output signal $V_{CMP\_OUT}$ from the first voltage level to the second voltage level may be the time that is used to determine of measure the response time or resolve time of the sense amplifier circuit 400.

In an example embodiment, which is described in further detail below, when the switch SW closes, the comparator circuit 406 may begin outputting its output signal $V_{CMP\_OUT}$ at a high level. However, if the memory cell 404 is programmed as an on-cell, when switch SW closes, the cell current $I_{CELL}$ may increase to a current level sufficiently above the reference current $I_{REF}$ to cause the comparator circuit 406 to transition its output signal $V_{OUT\_CMP}$ from the high voltage level to a low voltage level. Calibration circuitry for the sense amplifier circuit 400 may use the time that the transition from the high level to the low level occurs to determine or measure the response time or resolve time of the sense amplifier circuit 400, which is described in further detail below.

Just before the sense amplifier circuit 400 performs a sense operation, a bitline conditioning operation may be performed in order to improve, make faster, or speed up the response time of the amplifier circuit 400. In general, a bitline conditioning operation may cause the cell current $I_{CELL}$ to flow at a non-zero conditioning amount or level that is in between the on-cell current amount and the off-cell current amount. Causing the cell current $I_{CELL}$ to flow at the conditioning level just before a sense operation may speed up the response time of the sense amplifier circuit 400 because the conditioning level is closer to both the on-cell current amount and the off-cell current. To illustrate, suppose the on-cell current is 140 nA, the off-cell current is 40 nA, and the response time of the sense amplifier circuit 400 is measured with reference to when the sense amplifier 400 resolves that the memory cell is programmed as an on-cell. Just before a sense operation, suppose the cell current $I_{CELL}$ is set to a conditioning level in between 140 nA and 40 nA, such as 90 nA for example. Because a conditioning amount of 90 nA is closer to the on-cell current amount of 140 nA compared to 0 nA, then when the switch SW closes and the sense operation begins, it may take less time for the cell current $I_{CELL}$ to transition from the conditioning current level of 90 nA to the on-cell current level of 140 nA compared to if the cell current $I_{CELL}$ had to transition from 0 nA to 140 nA. This reduction in transition time of the cell current $I_{CELL}$ may provide a corresponding reduction in the response time of the sense amplifier circuit 400.

The sense amplifier circuit 400 may further include a bitline conditioning circuit 420 that is configured to perform the bitline conditioning operation—i.e., generate the cell current $I_{CELL}$ to flow at the conditioning amount or otherwise cause the cell current $I_{CELL}$ to flow at the conditioning amount just before a sense operation. Before the sense operation starts and the switch SW is open, the bitline conditioning circuit 420 may be configured to condition the bitline 402 by causing the cell current $I_{CELL}$ at the conditioning amount to flow through a current path of the sense amplifier circuit 400 coupled to the bitline 402. Prior to the sense operation, the cell current $I_{CELL}$ at the conditioning amount or level may flow from node B through the second NMOS transistor MN2 to node C. However, instead of flowing through the bitline 402 to the memory cell 404 because the switch SW is open, the cell current $I_{CELL}$ at the conditioning amount may be diverted at node C into the bitline conditioning circuit 420. The cell current $I_{CELL}$ flowing at the conditioning amount or the conditioning level in response to the bitline conditioning circuit 420 may alternatively or interchangeably be referred to as the conditioning current. Subsequently, when the sense operation begins and the sense amp enable signal $V_{SA\_EN}$ transitions to the first level to close the switch SW, an open circuit may simultaneously form between node C and the bitline conditioning circuit 420 so that the cell current $I_{CELL}$ flows through the switch SW and the bitline 402 to the memory cell 404. At this time, when the switch SW closes and an open circuit forms between the bitline conditioning circuit 420 and node C, the amount of the cell current $I_{CELL}$ may change from the conditioning amount to the on-cell current amount or the off-cell current amount depending on whether the memory cell 404 is programmed as an on-cell or an off-cell.

The conditioning current amount, or level, for the cell current $I_{CELL}$ may be an amount between the on-cell current amount and the off-cell current amount. In particular example configurations, the conditioning amount may be in the middle or halfway between the on-cell current amount and the off-cell current amount. As previously described, the reference current $I_{REF}$ may be an amount in between the on-cell and off-cell current, and in particular, a halfway value. Accordingly, as shown in FIG. 4, the bitline conditioning circuit 420 may include a third current source 422 configured to generate the reference current $I_{REF}$. Also, as shown in FIG. 4, the bitline conditioning circuit 420 may include a third NMOS transistor MN3 that is configured to electrically connect and disconnect the bitline conditioning circuit 420 from node C. The third NMOS transistor MN3 may be configured to inversely operate or be in opposite operating states compared to the switch SW. That is, when the switch SW is closed or turned on so that the bitline 402 and the memory cell 404 are connected to node C, the third NMOS transistor MN3 is open or turned off so that the bitline conditioning circuit 420 is disconnected from node C. Alternatively, when the switch SW is open or turned off so that the bitline 402 and the memory cell are disconnected from node C, the third NMOS transistor MN3 is closed or turned on so that the bitline conditioning circuit 420 is connected to node C. The operating states of the third NMOS transistor MN3 may be controlled by a conditioning control signal $V_{EQ}$, which may be applied to the gate terminal of the third transistor MN3 and, for some example configurations, be an inverse of the sense amp enable signal $V_{SA\_EN}$ applied to the switch SW. Accordingly, when the switch SW is open and the third NMOS transistor MN3 is closed, the third current source 422 may cause the cell current $I_{CELL}$ at the reference current amount $I_{REF}$ to flow through the second NMOS transistor MN2 to node C and through the third NMOS transistor MN3.

As previously described, the sense circuitry and data cache 144 (FIG. 2B) on a memory die 104 (FIG. 2B) may include a plurality of sense amplifier circuits, each coupled to a bitline of the memory array 142. The sense amplifier circuits may be configured to perform respective sense operations simultaneously in order to sense data stored in a plurality of memory cells at substantially the same time. For example, a single sense operation on a memory die 104 may include sensing a page of memory cells to load a page of data into data latches of the sense circuitry and data cache 144. To avoid errors during sense operations, it may be desirable for the sense amplifier circuits to have as close to respective response times as possible. That is, when sense amp enable signals $V_{SA\_EN}$ close respective switches SW, it may be desirable for the comparator circuits 406 of respective sense amplifier circuits to output their output signals $V_{CMP\_OUT}$ at the level indicative of the program state of the associated memory cell at the same time. However, due to mismatches (e.g., oxide thickness mismatches or variations) among the sense amplifier circuits, including among the comparator circuits 406 and/or their associated comparator input circuits 408, the response times among the various sense amplifier circuits may vary.

To compensate for the mismatches and response time variations, the bitline conditioning circuit 420 may include an adjustable current source circuit that can be adjustably set in order for the response time of the sense amplifier circuit 400 to be a desired response time. As used herein, the desired response time is a response time that the sense amplifier circuit 400 is to have following a calibration process. The desired response time may be a single time value or a plurality of time values within a desired response time range.

As described in further detail below, the memory system 100 may include calibration circuitry that is configured perform a calibration process on the sense amplifier circuit 400. By performing the calibration process, the calibration circuitry may identify a bitline conditioning amount for the cell current $I_{CELL}$ to have during bitline conditioning operations in order for the sense amplifier circuit 400 to have the desired response time when performing sense operations. By being adjustable, the adjustable current source circuit can be set to generate one of a various conditioning amounts determined from the calibration process.

Calibration circuitry can be used to perform calibration processes for a plurality of sense amplifier circuits. By performing the calibration processes for a plurality of sense amplifier circuits, and setting their respective adjustable current source circuits to certain respective conditioning levels determined from the calibration processes, the various sense amplifier circuits may all be calibrated to have the desired response times, and therefore have calibrated response times that match, or at least more closely match, each other compared to if the calibration processes were not performed. Example calibration processes for the sense amplifier circuit 400 are described in further detail below.

In an example configuration of the bit conditioning circuit 420, the adjustable current source circuit may include a fixed current source and an adjustable current source. The fixed current source may be the third current source 422 configured to generate the reference current $I_{REF}$. The adjustable current source may include a fourth current source 424 configured to generate an adjustment reference current $\Delta I_{REF}$. The amount of the adjustment reference current $\Delta I_{REF}$ may vary, and the amount may depend and/or be set by an adjustment amount control signal DEL_CTRL received by the fourth current source 424.

In addition, the bitline conditioning circuit 420 may include a fourth NMOS transistor MN4 that is configured to electrically connect and disconnect the fourth current source 424 from the remaining portion of the bitline condition circuit 420. For example, the reference current $I_{REF}$ generated by the third current source 422 may provide a baseline conditioning amount for the cell current $I_{CELL}$. If that baseline amount is not to be adjusted, then the fourth NMOS transistor MN4 may be turned off to disconnect the fourth current source 424 from the rest of the bitline conditioning circuit 420. Under this configuration, the third current source 422 may be the sole contributor to setting the conditioning amount of the cell current $I_{CELL}$. Alternatively, if the baseline amount $I_{REF}$ is to be adjusted, then the fourth NMOS transistor MN4 may be turned on to connect the fourth current source 424 to the rest of the bitline conditioning circuit 420. Under this configuration, the third current source 422 and the fourth current source 424 may contribute in combination to setting the conditioning amount of the cell current $I_{CELL}$. In particular, the conditioning amount may be the sum of the reference amount and the adjustment amount, or $I_{REF}+\Delta I_{REF}$.

As shown in FIG. 4, a source terminal of the fourth NMOS transistor MN4 may be coupled to a drain terminal of the third NMOS transistor MN3 and the third current source 422 at a node E, its drain terminal may be coupled to the fourth current source 424, and its gate terminal may be configured to receive an adjustment enable signal $V_{ADJ\_EN}$. Whether the fourth current source 424 participates or does not participate in setting the conditioning amount may be controlled by the adjustment enable signal $V_{ADJ\_EN}$, which may function to turn on and off the fourth NMOS transistor MN4. That is, when the adjustment enable signal $V_{ADJ\_EN}$ turns on the fourth NMOS transistor MN4, the fourth current source 424 may be connected to the rest of the bitline conditioning circuit 420 participate in setting the conditioning amount. Alternatively, when the adjustment enable signal $V_{ADJ\_EN}$ turns off the fourth NMOS transistor MN4, the fourth current source 424 may be disconnected from the rest of the bitline conditioning circuit 420 and be uninvolved in the setting the conditioning amount. Also, as previously mentioned, the adjustment amount $\Delta I_{REF}$ may be one of a plurality of values, and which value the adjustment amount $\Delta I_{REF}$ is may be determined by and/or depend on a corresponding level or value of the adjustment amount control signal DEL_CTRL.

As previously described, the response time of the sense amplifier circuit 400 may be measured with reference to when the comparator circuit 406 resolves. As such, the more time that the comparator circuit 406 takes to resolve, the slower the response time of the sense amplifier circuit 400 may be considered. On the other hand, the sooner that the comparator circuit 406, the faster the response time of the sense amplifier circuit 400 may be considered.

As described in further detail below, calibration circuitry may be configured to perform a calibration process that measures an uncalibrated response time of the sense amplifier circuit 400. In response to the calibration process, the calibration circuitry may generate configuration data that is used to set a conditioning level of the cell current $I_{CELL}$ to cause the sense amplifier circuit 400 to have the desired response time. As used herein, an uncalibrated response time of the sense amplifier circuit 400 is a response time of the sense amplifier circuit 400 when the conditioning level of the cell current $I_{CELL}$ is not set according to the configuration data. In addition or alternatively, an uncalibrated response time of the sense amplifier circuit 400 is a response time of the sense amplifier circuit 400 before and/or during a calibration process is performed. Conversely, a calibrated response time of the sense amplifier circuit 400 is a response time of the sense amplifier circuit 400 when the conditioning level of the cell current $I_{CELL}$ is set according to the configuration data generated as a result of a calibration process. In addition or alternatively, a calibrated response time of the sense amplifier circuit 400 is a response time of the sense amplifier 400 that the calibration circuitry determines in response to performance of a calibration process.

Prior to performance of a calibration process, the bitline conditioning circuit 420 may be configured to generate the cell current $I_{CELL}$ at an initial conditioning amount or level. The cell current $I_{CELL}$ flowing at the initial conditioning level may provide the sense amplifier circuit 400 with the uncalibrated response time or at least an initial uncalibrated response time. As a result of a calibration process, if the calibration circuitry determines that the response time is acceptable or within an acceptable range—meaning that the response time is the desired response time—then the calibration circuitry may determine that the initial conditioning current level does not have to be adjusted. Alternatively, if the calibration circuitry determines that the uncalibrated response time is too fast, then the calibration circuitry may determine that the conditioning amount is to be decreased from the initial conditioning level, which may have the effect of slowing down the response time of the sense amplifier circuit 400 to the desired response time. Alternatively, if the response time is deemed too slow, then the calibration circuitry may determine that the conditioning amount is to be increased from the initial conditioning level, which may have the effect of speeding up the response time of the sense amplifier circuit 400 to the desired response time.

For the example configuration of the adjustable current source circuit shown in FIG. 4, the third current source 422 may be configured to generate the cell current $I_{CELL}$ at the initial conditioning level, such as the reference level $I_{REF}$. For such configurations, in order for the bitline conditioning circuit to generate the cell current $I_{CELL}$ at the initial conditioning level, the fourth current source 424 may be deactivated or disconnected from the rest of the bitline conditioning circuit 420 so that it does not contribute to generating the cell current $I_{CELL}$. Alternatively, if the calibration circuitry determines that the conditioning level is to be adjusted from its initial level to a new level (i.e., one that is higher or lower than the reference level $I_{REF}$), then the fourth current source 424 may contribute to setting the conditioning amount by having the effect of increasing or decreasing the conditioning amount relative to the reference amount $I_{REF}$. How much the fourth current source 424 increases or decreases the new conditioning amount from the initial conditioning amount may depend on how much the calibration circuitry determines that the conditioning amount is to change in order to move the response time of the sense amplifier circuit 400 to the desired response time.

Figure 5A:
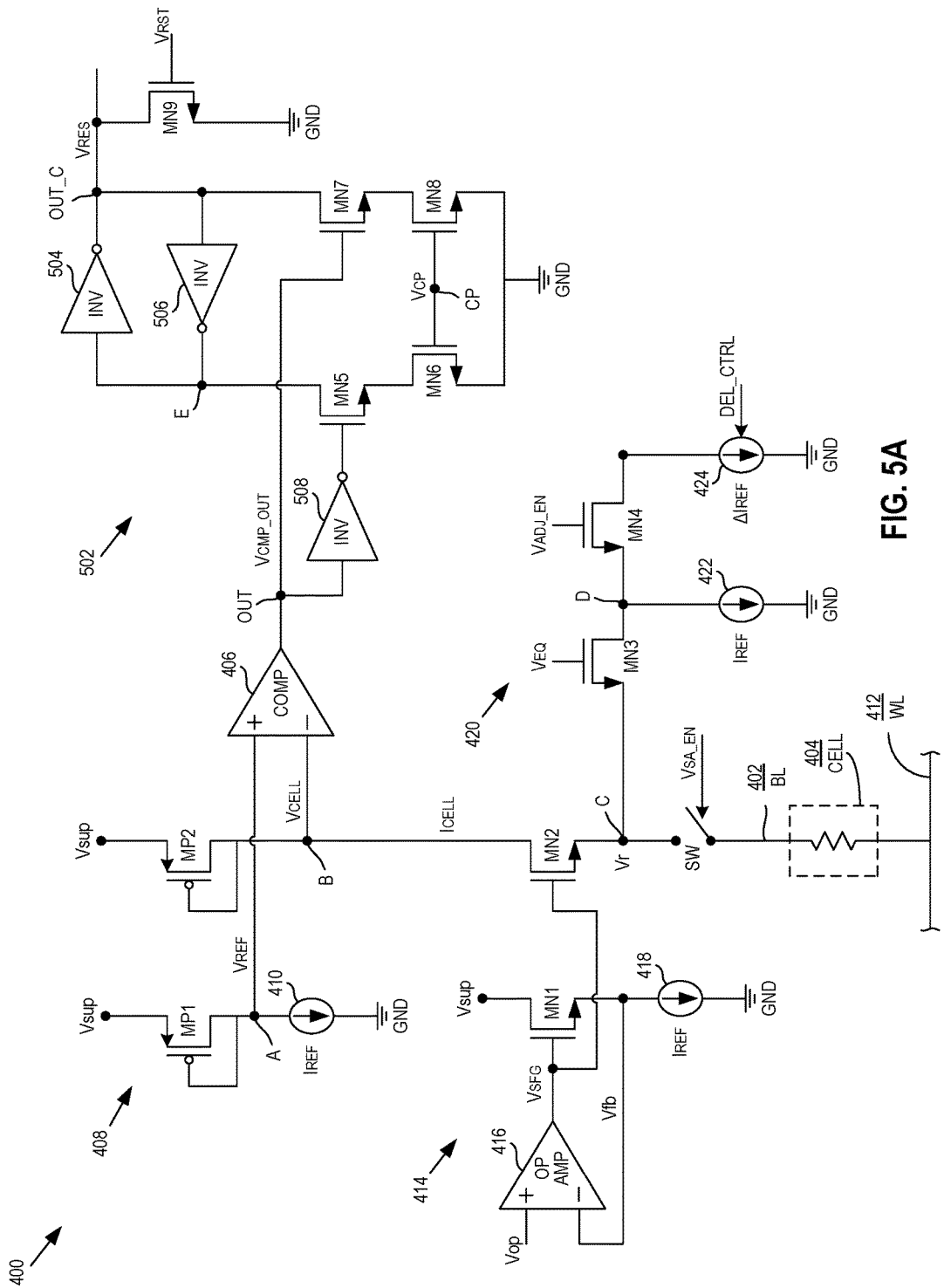
FIG. 5A is a circuit schematic diagram of a response time detection circuit of calibration circuitry connected to the sense amplifier circuit of FIG. 4.
Figure 5B:
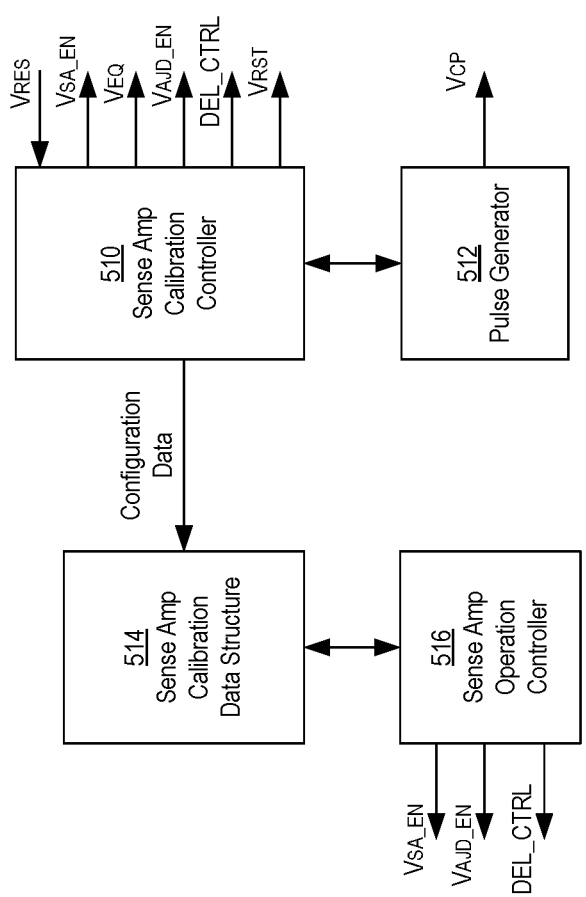
FIG. 5B is a block diagram of components used for calibration and sense operation processes for the sense amplifier circuit and the response time detection circuit shown in FIGS. 4 and 5A.

The calibration circuitry for the sense amplifier circuit 400 and calibration processes performed using the calibration circuitry are now described with reference to FIGS. 5A-9. FIG. 5A shows a circuit schematic of the sense amplifier circuit 400 connected to a response time detection circuit 502 of calibration circuitry configured to perform a calibration process for the sense amplifier circuit. FIG. 5B shows a block diagram of a calibration controller 510 in communication with a pulse generator 512. The calibration controller 510 may be configured to control or conduct a calibration process, which may include outputting control signals to the sense amplifier circuit 400 and by controlling the pulse generator 512 to supply a pulse sequence $V_{CP}$ to the response time detection circuit 502. By controlling or conducting the calibration process, the calibration controller 510 may be configured to measure or determine an uncalibrated response time of the sense amplifier circuit 400. Based on the determination, the calibration controller 510 may be configured to set, adjust, and/or control the conditioning amount or level of the cell current $I_{CELL}$ for the sense amplifier circuit 400 and/or the memory cell 404, which in turn may set, adjust, and/or control the response time of the sense amplifier circuit 400. By measuring the response time and setting the conditioning amount based on the measurements, a desired, calibrated response time for the sense amplifier circuit 400 may be achieved. Upon determining a desired conditioning level to achieve the desired response time, the calibration controller 510 may generate configuration data that is then used to set or control the adjustable current source circuitry of the bitline conditioning current 420 so that the cell current $I_{CELL}$ flows at the desired conditioning level just prior to sense operations.

In further detail with reference to FIG. 5A, during a calibration process, the response time detection circuit 502 may be configured to detect a response time of the sense amplifier circuit 400. As previously described, the response time of the detection circuit 502 is the time the sense amplifier circuit 400 takes to resolve, detect, sense, or determine the logic level of the data that the memory cell 404 is storing. As such, the response time detection circuit 502 may detect a response time of the sense amplifier circuit 400 by detecting when the sense amplifier circuit 400 resolves. In particular, during a calibration process, the response time detection circuit 502 may detect when the sense amplifier circuit 400 resolves that the memory cell 404 is programmed as an on-cell. As previously described, the sense amplifier circuit 400 may resolve at the time that the comparator circuit 406 outputs the output signal $V_{CMP\_OUT}$ at a high voltage level indicating that the memory cell 404 is programmed as an on-cell. Accordingly, the response time detection circuitry may detect the response time of the sense amplifier circuit 400 by detecting when the comparator circuit 406 outputs the output signal $V_{CMP\_OUT}$ at the high level to indicate that the memory cell 404 is programmed as an on-cell.

The response time detection circuit 502 may be configured generate a resolve signal $V_{RES}$ (otherwise referred to as a detection signal or an indication signal) to indicate that it has detected when the sense amplifier circuit 400 resolved. In a particular implementation, the response time detection circuit 502 may be configured to generate the resolve signal $V_{RES}$ at a first (e.g., low) voltage level to indicate that it has not yet detected that the sense amplifier circuit 400 has resolved, and may be configured to generate the resolve signal $V_{RES}$ at a second (e.g., high) voltage level to indicate that it has resolved. The time that the response time detection circuit 502 transitions the voltage of the resolve signal $V_{RES}$ from the first voltage level to the second voltage level may be the time that the response time detection circuit 502 detected the sense amplifier circuit 400 to resolve. As described in further detail below, the calibration controller 510 may use the resolve signal $V_{RES}$ to determine when the resolve signal $V_{RES}$ transitions from the first voltage level to the second voltage level, in order to measure the response time of the sense amplifier circuit 400.

The response time detection circuit 502 may include a latch circuit configured as a pair of cross-coupled inverters, including a first inverter (INV) 504 and a second inverter 506. The first inverter 504 may include an input coupled to an output of the second inverter 506 at a node E. Also, the output of the first inverter 504 and the input of the second inverter 506 may be coupled together at the output node OUT_C where the resolve signal $V_{RES}$ is generated.

In addition, the cross-coupled inverters may be connected to a pair of series-connected transistor branches, with each branch including a pair of NMOS transistor connected in series. A first branch may include a fifth NMOS transistor MN5 and a sixth NMOS transistor MN6. A drain terminal of the fifth NMOS transistor MN5 may be connected to node E and a source terminal of the fifth NMOS transistor MN5 may be connected to the drain terminal of the sixth NMOS transistor MN6. The source terminal of the sixth NMOS transistor MN6 may be connected to the ground reference voltage GND. Also, the gate terminal of the fifth NMOS transistor MN5 may be coupled to an output of an inverter 508 that is configured to invert the output signal $V_{CMP\_OUT}$ of the comparator circuit 406. Accordingly, the fifth NMOS transistor MN5 may be configured to receive at its gate terminal an inverted version of the output signal $V_{CMP\_OUT}$ of the comparator circuit 406.

The second branch may include a seventh NMOS transistor MN7 and an eighth NMOS transistor MN8. A drain terminal of the seventh NMOS transistor MN7 may be connected to the output node OUT_C and a source terminal of the seventh NMOS transistor MN7 may be connected to the drain terminal of the eighth NMOS transistor MN8. The source terminal of the eighth NMOS transistor MN8 may be connected to the ground reference voltage GND. Also, the gate terminal of the seventh NMOS transistor MN7 may be coupled to the output of the comparator circuit 406. Accordingly, the seventh NMOS transistor MN7 may be configured to receive at its gate terminal the output signal $V_{CMP\_OUT}$ of the comparator circuit 406.

Before the sense amplifier circuit 400 resolves, the comparator circuit 406 may generate its output signal $V_{CMP\_OUT}$ at a high voltage level, which may be applied to the gate terminal of the seventh NMOS transistor MN7 to turn on the seventh NMOS transistor MN7. Also, the high voltage level of the output signal $V_{CMP\_OUT}$ may be sent to the inverter 508. In response, the inverter 508 may generate its output at a low level to turn off the fifth NMOS transistor MN5. Subsequently, when the sense amplifier circuit 400 resolves, the comparator circuit 406 may generate its output signal $V_{CMP\_OUT}$ at a low voltage level, which may be applied to the gate terminal of the seventh NMOS transistor MN7 to turn off the seventh NMOS transistor MN7. Also, the low voltage level of the output signal $V_{CMP\_OUT}$ may be sent to the inverter 508. In response, the inverter 508 may generate its output at a high level to turn on the fifth NMOS transistor MN5.

In addition, as shown in FIG. 5, the gate terminals of the sixth and eighth NMOS transistors MN6, MN8 may be connected or tied together at a node CP. As described in further detail below, the gate terminals of the sixth and eighth NMOS transistors MN6, MN8 may be configured to receive a calibration pulse sequence $V_{CP}$ of voltage pulses. During a voltage pulse, while the voltage pulse is occurring and/or while a voltage pulse is being received, the sixth and eighth NMOS transistors MN6, MN8 may be turned on. Alternatively, while a voltage pulse is not occurring and/or not being received, the sixth and eighth NMOS transistors MN6, MN8 may be turned off.

The response time detection circuit 502 may be configured to generate the resolve signal $V_{RES}$ based on the combination of the output signal $V_{CMP\_OUT}$ and the calibration pulse sequence $V_{CP}$. That is, in response to the response time detection circuit 502 receiving a voltage pulse, the response time detection circuit 502 may generate the resolve signal $V_{RES}$ at a level indicative of whether or not the sense amplifier circuit 400 resolved. In particular, prior the sense amplifier circuit 400 resolving, the comparator circuit 406 may output its output signal $V_{CMP\_OUT}$ at a high voltage level, which in turn may cause the seventh NMOS transistor MN7 to turn on and the fifth NMOS transistor MN5 to turn off. Also, a voltage pulse supplied to the eighth NMOS transistor MN8 may turn on the eighth NMOS transistor MN8. The combination of the seventh and eighth NMOS transistors MN7, MN8 of the second branch being turned on may pull down the resolve signal $V_{RES}$ to a low voltage level (e.g., to ground GND) to indicate that the sense amplifier circuit 400 has not yet resolved. Also, the fifth NMOS transistor MN5 turned off may cause the first transistor branch to be electrically disconnected from the rest of the response time detection circuit 502.

Alternatively, when the sense amplifier circuit 400 has resolved, the comparator 406 may output the output signal $V_{CMP\_OUT}$ at a low voltage level, which in turn may cause the seventh NMOS transistor MN7 to turn off and the fifth NMOS transistor MN5 to turn on. Also, a voltage pulse supplied to the sixth NMOS transistor MN6 may turn on the sixth NMOS transistor MN6. The combination of the fifth and sixth NMOS transistors MN5, MN6 of the first branch being turned on may pull down the voltage at node E to a low voltage level (e.g., to ground GND), which in turn may cause the first inverter 504 to generate the resolve signal $V_{RES}$ at a high voltage level to indicate that the sense amplifier circuit 400 has resolved. The cross-coupled inverters 504, 506 may operate to hold or maintain the resolve signal $V_{RES}$ at the high voltage level. Also, the seventh NMOS transistor MN7 turned off may cause the second transistor branch to be electrically disconnected from the rest of the response time detection circuit 502.

In sum, the response time detection circuit 502 may generate the resolve signal $V_{RES}$ at a first (e.g., high) voltage level to indicate that the sense amplifier circuit 400 has resolved and at a second (e.g., low) voltage level to indicate that the sense amplifier circuit 400 has not yet resolved based a combination of the voltage level of the output signal $V_{CMP\_OUT}$ of the comparator circuit 406 and occurrence of a voltage pulse of the calibration pulse sequence $V_{CP}$. In this way, the response time detection circuit 502 may be configured to generate the resolve signal $V_{RES}$ to indicate whether the sense amplifier circuit 400 has resolved or not relative to the timing of the voltage pulses of the calibration pulse sequence $V_{CP}$.

Referring to FIG. 5B, the calibration circuitry may further include the sense amp calibration controller 510 and the pulse generator 512. As previously described, the sense amp calibration controller 510 may be configured to control a calibration process for the sense amplifier circuit 400, and the pulse generator 512 may be configured to generate the calibration pulse sequence $V_{CP}$ for the calibration process.

FIG. 5B also shows a sense amp calibration data structure 514 (such as a table or other similar data structure) and a sense amp operation controller 516. The sense amp calibration data structure 514 may be configured to store configuration data for the sense amplifier circuit 400, which may be determined by the sense amp calibration controller 510. The sense amp operation controller 516 may be configured to control sense operations performed by the sense amplifier circuit 400 outside of the calibration process, such as during normal operation when the sense amplifier circuit 400 is performing sense operations as part of read operations to read data. The sense amp operation controller 516 may be configured to access the configuration data to set the conditioning amount for the cell current $I_{CELL}$ when controlling the sense amplifier circuit 400. For example, upon accessing the configuration data, the sense amp operation controller 516 may be configured to set an adjustable current source of the bitline conditioning circuit 420 according to the configuration data so that the cell current $I_{CELL}$ flows at the conditioning amount during bitline conditioning operations.

For some example configurations, the sense amp calibration controller 510, the pulse generator 512, the sense amp calibration data structure 514, and the sense amp operation controller 516 may be located on the same memory die 104 as the sense amplifier circuit 400. In particular example configurations with reference to FIG. 2B, the calibration controller 504 and the sense amp operation controller 516 may be components of and/or integrated with the control logic 152, and the pulse generator 506 may be a component of and/or integrated with the power control circuit 156. Also, the sense amp calibration data structure 514 may be stored in any of various storage locations within and/or external to the memory system 100. For particular example configurations, the sense amp calibration data structure 514 may be stored in a portion of the memory array 142 of the same memory die 104 on which the sense amplifier circuit 400 is located. Optionally, the sense amp calibration data structure 514 (or a copy thereof) may be stored in and/or loaded into the volatile memory 154 during normal operation, and the sense amp operation controller 516 may access the sense amp calibration data loaded into the volatile memory 154 when configuring or setting the bitline conditioning circuit 420 of the sense amplifier circuit 400.

In further detail, to perform and control a calibration process, the sense amp calibration controller 510 may be configured to generate and output the sense amp enable signal $V_{SA\_EN}$, the conditioning control signal $V_{EQ}$, the adjustment enable signal $V_{ADJ\_EN}$, and the adjustment amount control signal DEL_CTRL. In addition, the sense amp calibration controller 510 may be configured to control the pulse generator 512, such as control when the pulses generator 512 outputs the calibration pulse sequence $V_{CP}$.

In addition, the sense amp calibration controller 510 may be configured to receive the resolve signal $V_{RES}$. In response to receipt of the resolve signal $V_{RES}$, the sense amp calibration controller 510, such as with measurement circuit component, may be configured to determine or measure a timing relationship between a response time of the sense amplifier circuit 400 and the timing of the calibration pulse sequence $V_{CP}$. As used herein, a timing relationship between a response time of the sense amplifier circuit 400 and the calibration pulse sequence $V_{CP}$ may be a relationship of when the sense amplifier circuit 400 resolved relative to when the pulses of the pulse sequence $V_{CP}$ are supplied to the response detection circuit 502. Similarly, a timing relationship between a response time of the sense amplifier circuit 400 and an individual pulse of the pulse sequence $V_{CP}$ may be a relationship of when the sense amplifier circuit 400 resolve relative to the individual pulse. Also, a given timing relationship may be associated with a given conditioning amount for the cell current $I_{CELL}$. For example, the sense amplifier circuit 400 may resolve at a certain time relative to one or more pulses of the pulse sequence $V_{CP}$ for a given conditioning amount for the cell current $I_{CELL}$.

In measuring a timing relationship between the response time of the sense amplifier circuit 400 and the pulse sequence $V_{CP}$, the calibration controller 510 may be configured to determine when the resolve signal $V_{RES}$ transitions from the low voltage level to the high voltage level relative to the timing of the voltage pulses. This determination, in turn, may indicate when the sense amplifier circuit 400 resolved relative to the when the voltage pulses were supplied to the response time detection circuit 502. By identifying when the sense amplifier circuit 400 resolved relative to when the voltage pulses were supplied, the calibration controller 510 may be configured to measure the response time of the sense amplifier circuit 400.

Based on the measurement, the sense amp calibration controller 510 may be configured to determine and/or generate configuration data that determines a conditioning amount for the cell current $I_{CELL}$. The sense amp calibration controller 510 may be configured to store the configuration data in the sense amp calibration data structure 514. As previously described, upon the configuration data being stored in the sense amp calibration data structure 514, the sense amp operation controller 516 may access the configuration data to configure or set the bitline conditioning circuit 420 for bitline conditioning and sense operations performed by the sense amplifier circuit 400 during normal operation of the memory system 100.

Figure 6:
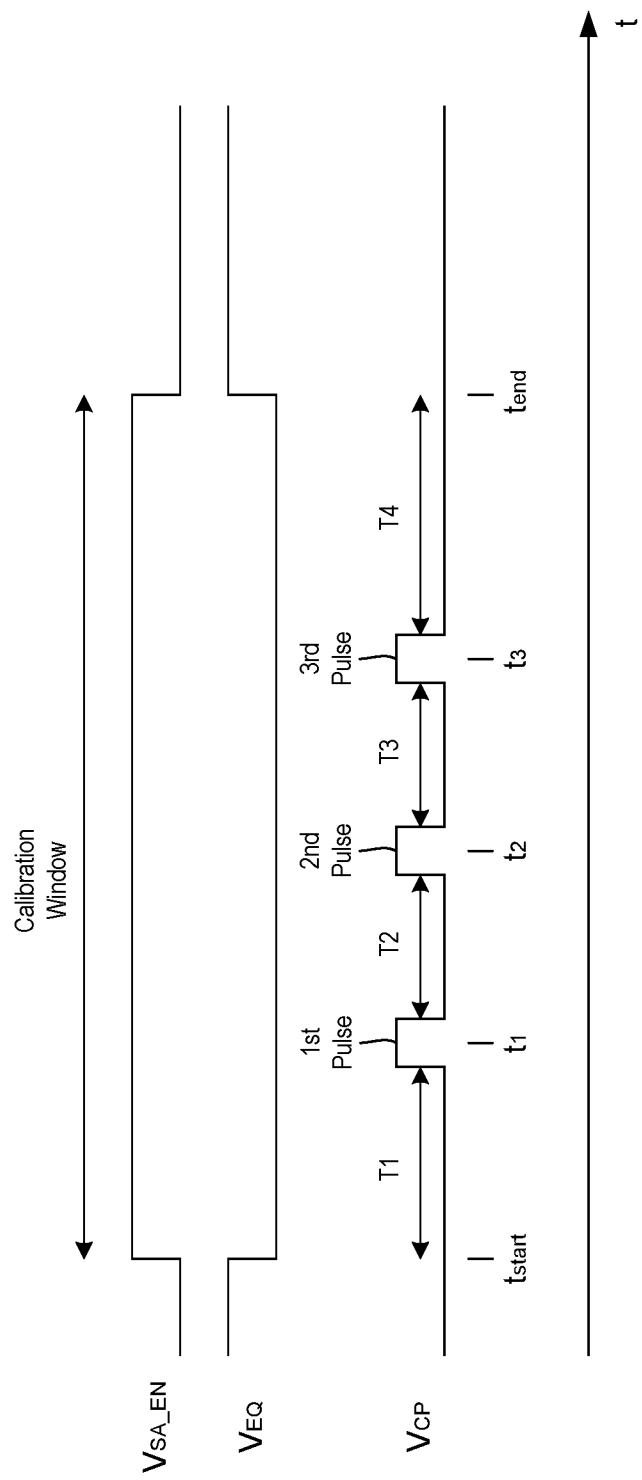
FIG. 6 is a timing diagram of signals generated during a first example sense amplifier calibration process.
Figure 7:
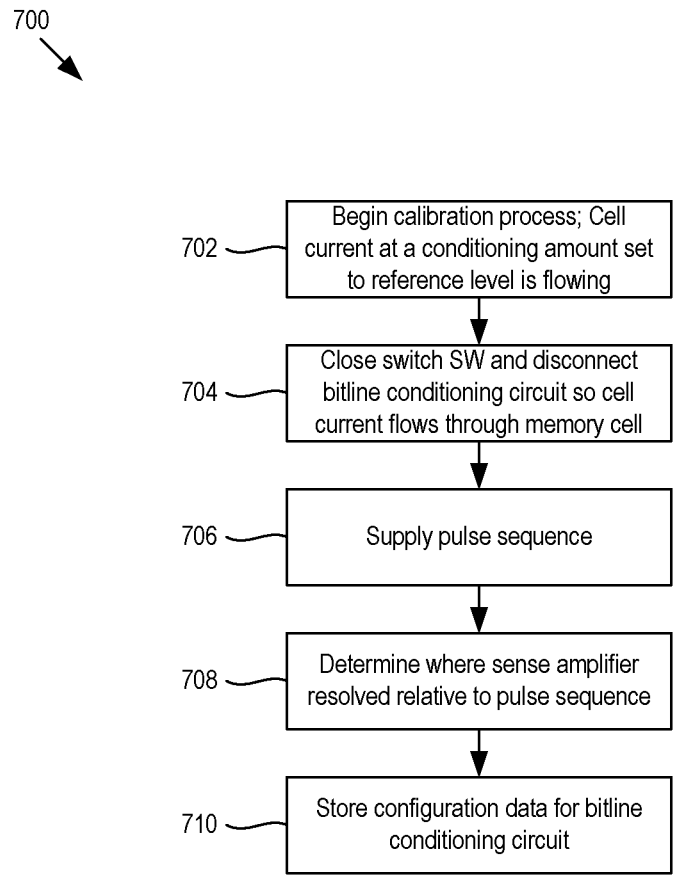
FIG. 7 is a flow chart of an example method of performing the first example sense amplifier calibration process.
Figure 8:
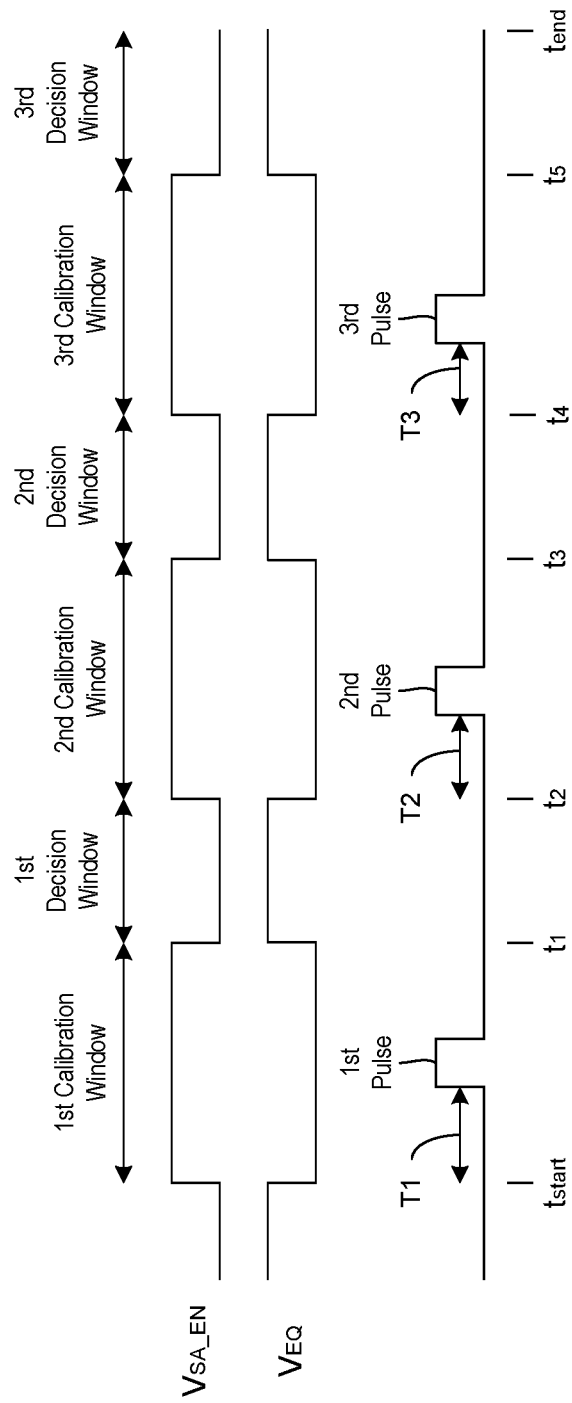
FIG. 8 is a timing diagram of signals generated during a second example sense amplifier calibration process.
Figure 9:
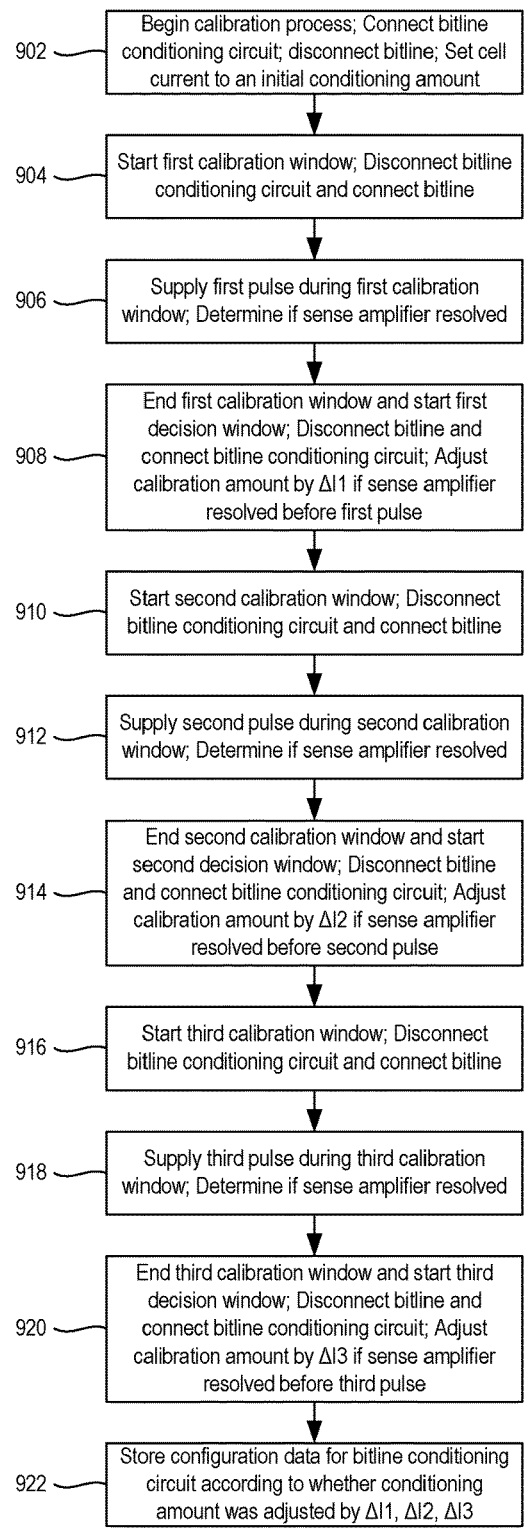
FIG. 9 is a flow chart of an example method of performing the second example sense amplifier calibration process.

Two example sense amplifier calibration processes are now described with further reference to FIGS. 6-9. In the first example calibration process, a calibration pulse sequence $V_{CP}$ comprising one or more voltage pulses is supplied during a single calibration time period or window. The calibration controller 510 may be configured to determine or measure if and/or when the sense amplifier circuit 400 resolves relative to the pulse(s) of the pulse sequence $V_{CP}$. Based on the determination or measurement, the calibration controller 510 may be configured to generate the configuration data. In the second example calibration process, each voltage pulse of a calibration pulse sequence $V_{CP}$ may be supplied during a respective one of a plurality of calibration time periods or windows. After a calibration window ends and/or in between consecutive calibration windows, a decision window may occur during which the calibration controller 510 determines whether to adjust the conditioning amount based on whether the calibration controller 510 detected that the sense amplifier circuit 400 resolved during the last or immediately prior calibration window. FIG. 6 shows a timing diagram and FIG. 7 shows a flow chart of an example method of performing the first example calibration process. FIG. 8 shows a timing diagram and FIG. 9 shows a flow chart of an example method of performing the second example calibration process.

Referring particularly to FIG. 6, a calibration window is shown from extending from an initial or start time $t_{start}$ to an end time $t_{end}$. During the calibration window, a calibration pulse sequence $V_{CP}$ may be supplied to the sixth and eighth NMOS transistors MN6, MN8. FIG. 6 shows the calibration pulse sequence $V_{CP}$ as including three voltage pulses, including a first voltage pulse supplied at a first time $t_1$, a second voltage pulse supplied at a second time $t_2$, and a third voltage pulse supplied at a third time $t_3$. The first, second, and third times $t_1$, $t_2$, $t_3$ may be predetermined times at which the first, second, and third voltage pulses are supplied. Otherwise stated, the pulse generator 512 may be configured to supply the voltages pulses of the pulse sequence $V_{CP}$ at predetermined times or time intervals.

In addition, prior to the start time $t_{start}$, the calibration controller 510 may cause an initial conditioning amount of the cell current $I_{CELL}$ to flow. To do so, prior to the start time $t_{start}$, the calibration controller 510 may generate the sense amp enable signal $V_{SA\_EN}$ at a low level to open the switch SW to disconnect the bitline 402 and the memory cell 404 from node C, and may generate the conditioning control signal $V_{EQ}$ at a high level to connect the bitline conditioning circuit 420 to node C. In a particular example configuration, the initial conditioning amount may be the reference amount $I_{REF}$. Accordingly, in order to have the cell current $I_{CELL}$ flow at the reference amount $I_{REF}$, the calibration controller 510 may generate the adjustment enable signal $V_{ADJ\_EN}$ at a low level so that the fourth current source 424 is disconnected from the rest of the bitline conditioning circuit 420. This way, only the third current source 422 generating the reference current $I_{REF}$ is involved in setting the initial conditioning amount. Accordingly, prior to the start time $t_{start}$, the cell current $I_{CELL}$ flows at the reference current level $I_{REF}$ from node B to node C and then flows into the bitline conditioning circuit 420. Subsequently, at the start time $t_{start}$, the levels of the sense amp enable signal $V_{SA\_EN}$ and the conditioning control signal $V_{EQ}$ are reversed so that the switch SW closes to connect the bitline 402 and the memory cell 404 to node C and open the third NMOS transistor MN3 to disconnect the bitline conditioning circuit 420 from node C. The calibration controller 510 may then control the pulse generator 512 to issue or supply the calibration pulse sequence $V_{CP}$ during the calibration window.

The response time of the sense amplifier circuit 400 when the cell current $I_{CELL}$ is set to the initial conditioning level (e.g., the reference level $I_{REF}$) may be an uncalibrated response time of the sense amplifier circuit 400. In response to the supply of the voltage pulses at the predetermined times or time intervals during the calibration window, and when the conditioning level for the cell current $I_{CELL}$ was set to the initial conditioning level just prior to the start of the calibration window, the calibration controller 510 may be configured to determine or measure the uncalibrated response time by determining a timing relationship between the response time of the sense amplifier circuit 400 and the times at which the voltage pulses of the pulse sequence $V_{CP}$ are supplied to the response time detection circuit 502. In measuring the timing relationship, the calibration controller 510 may be configured to determine whether the sense amplifier circuit 400 resolved relative to the predetermined times or time intervals at which the voltage pulses of the pulse sequence $V_{CP}$ are supplied. In particular, the calibration controller 510 may be configured to receive the resolve signal $V_{RES}$, and based on the voltage level of the resolve signal $V_{RES}$ during the calibration window, the calibration controller 510 determine or measure when the sense amplifier circuit 400 resolves relative to the timing of the three voltage pulses.

In order to determine the timing relationship, the calibration controller 510 may be configured to determine whether the sense amplifier circuit 400 resolved in one of a plurality of time periods defined by and/or extending in between the pulses of the pulse sequence $V_{CP}$. If the response time detection circuit 502 generates the resolve signal $V_{RES}$ to indicate that the sense amplifier circuit 400 resolved in response to a given pulse being supplied to the response time detection circuit 502, the calibration controller 510 may be configured to determine that the sense amplifier circuit 400 resolved in the time period prior to and/or during the supply of the given pulse. For example, the calibration controller 510 may be configured to determine whether the sense amplifier circuit 410 resolved during a first time period T1 before the first pulse is supplied, during a second time period T2 after the first pulse is supplied and before the second pulse is supplied, during a third time period T3 after the second pulse is supplied and before the third pulse is supplied, or during a fourth time period T4 after the third pulse is supplied. Alternatively, the calibration controller 510 may determine that the sense amplification circuit 400 did not resolve during the calibration window, in which case the calibration controller 510 may identify the sense amplifier circuit 400 as resolving during the fourth time period T4 after the third (last) voltage pulse.

In other example configurations, the time periods T1, T2, T3 may be considered to extend up to and/or through the time that a following or next voltage pulse is supplied, such that when supply of the following or next voltage pulse ends, the next time period may begin. For example, the first time period T1 may extend up through the supply of the first pulse and then second (next) time period T2 may begin when supply of the first pulse ends. For these example configurations, the calibration controller 510 may determine the timing relationship to indicate that the sense amplifier resolved or did not resolve by the time a given pulse is supplied.

During the first example calibration process, the memory cell 404 may be programmed in the on-state so that the sense amplifier circuit 400 resolves at the time that the comparator circuit 406 transitions the level of its output signal $V_{CMP\_OUT}$ from a high voltage level to a low voltage level. Accordingly, if the response time detection circuit 502 generates the resolve signal $V_{RES}$ at a high voltage level in response a given pulse being supplied, the calibration controller 510 may detect or measure the resolve signal $V_{RES}$ at the high voltage level and in response, identify that the sense amplifier circuit 400 resolved prior to and/or by the time the given pulse is supplied. Alternatively, if the response time detection circuit 502 generates the resolve signal $V_{RES}$ at a low voltage level in response to a given pulse being supplied, the calibration controller 510 may detect or measure the resolve signal $V_{RES}$ at the low voltage level and in response, identify that the sense amplifier circuit 400 did not resolve prior to and/or by the time the given pulse is supplied.

Under this detection and measurement scheme, the calibration controller 510 may determine during which of the four time periods T1, T2, T3, T4 that the sense amplifier circuit 400 resolved. Each of the time periods T1, T2, T3, and T4 may correspond to an associated response time characterization or category that characterizes the speed of the uncalibrated response time of the sense amplifier circuit 400. The first time period T1 may be associated with a fastest response time characterization or category, the second time period T2 may be associated with a second fastest response time characterization or category, the third time period T3 may be associated with a third fastest response time characterization or category, and the fourth time period T4 may be associated with a fourth fastest (or slowest) response time characterization or category. Accordingly, the calibration controller 510 may be configured to determine during which of the time periods T1, T2, T3, T4 the sense amplifier circuit resolved, and based on the determination, characterize the speed of the uncalibrated response time according to the response time characterization or category associated with the determined time period. In this context, the determination or measurement of the uncalibrated response time of the sense amplifier circuit 400 may not necessarily be an actual measurement of the uncalibrated response time in units of time (e.g., microseconds, nanoseconds, picoseconds, etc.), but instead may be a measurement that characterizes or categorizes the speed of the uncalibrated response time.

The calibration controller 510 may be configured to determine whether and/or how much to adjust the conditioning level from the reference current level $I_{REF}$ based on which time period T1, T2, T3, T4 the sense amplifier circuit resolved. This may be done in various ways and/or in accordance with various configurations. For some example configurations, one of the time periods T1, T2, T3, T4 may be a desired or acceptable time period, which may be a time period during which it is desired or acceptable for the sense amplifier circuit 400 to resolve. The other time periods T1, T2, T3, T4 may be adjustment time periods.

If the calibration controller 510 determines or measures the sense amplifier circuit 400 to resolve during the acceptable time period, then the calibration controller 510 may determine that no adjustment of the conditioning amount from the initial conditioning amount is needed. As such, the calibration controller 510 may determine that the conditioning amount for the cell current $I_{CELL}$ is to be kept at the initial amount (e.g., the reference level amount $I_{REF}$). Alternatively, if the calibration controller 510 determines or measures the sense amplifier circuit 400 to resolve during an adjustment time period, then the calibration controller 510 may determine that adjustment of the conditioning amount is needed. Each adjustment time period may indicate and/or correspond to an associated adjustment amount away from the initial conditioning amount. Accordingly, how much the conditioning amount is to be adjusted away from the initial conditioning amount may be determined according to which adjustment time period the sense amplifier circuit 400 resolved.

Which time period is the desired or acceptable time period and which time periods are the adjustment time periods may vary for various, different configurations. In one example configuration, the first time period T1 may be the acceptable time period, and the second, third, and fourth time periods T2, T3, T4 may be the adjustment time periods. Accordingly, if the calibration controller 510 determines that the sense amplifier circuit 400 resolved during the first time period T1, the calibration controller 510 may determine that no adjustment is needed, and that the conditioning amount is to be kept at the initial conditioning amount. Alternatively, if the calibration controller 510 determines that the sense amplifier circuit 400 resolved during the second time period T2, the calibration controller 510 may determine that the conditioning amount is to be increased by a first adjustment amount $\Delta I1$; if the calibration controller 510 determines that the sense amplifier 400 resolved during the third time period T3, the calibration controller 510 may determine that the conditioning amount is to be increased by a second adjustment amount $\Delta I2$; and if the calibration controller 510 determines that the sense amplifier 400 resolved during the fourth time period T4, the calibration controller 510 may determine that the conditioning amount is to be increased by a third adjustment amount $\Delta I3$. The relationship between the adjustment amounts may be such that the second adjustment amount $\Delta I2$ is larger than the first adjustment amount $\Delta I1$, and the third adjustment amount is larger than the second adjustment amount $\Delta I2$, or mathematically: $\Delta I1 < \Delta I2 < \Delta I3$. In accordance with this relationship, the slower the response time, the more the conditioning amount is increased.

For another example configuration, the acceptable time period may be the second time period T2. If the calibration controller 510 determines that the sense amplifier circuit 400 resolved during the first time period T1, the calibration controller 510 may determine to reduce the conditioning amount from the reference level $I_{REF}$ by a negative adjustment amount $-\Delta I1$ in order to slow down the response time of the sense amplifier circuit 400. Also, similar to the other configuration, if the calibration controller 510 determines that the sense amplifier circuit 410 resolved during the third time period T3 or the fourth time period T4, the calibration controller 510 may determine that the conditioning amount is to be increased by a first positive adjustment amount $\Delta I2$ or a second positive adjustment amount $\Delta I3$, respectively.

Various other example configurations for determining whether and/or how much to adjust the conditioning amount may be possible. For example, in other example configurations, the acceptable time period may be the third time period T3 or the fourth time period T4. Also, the adjustment amounts may be represented in terms of absolute values (e.g., nanoamps), or alternatively in ratios or percentages, such as percent increases or decreases. Also, for configurations where the initial conditioning amount is the reference level $I_{REF}$, the adjustment amounts $\Delta I1$, $\Delta I2$, and $\Delta I3$ may be adjustment amounts away from the reference current amount $I_{REF}$. However, for other example configurations, the initial conditioning amount may be an amount other than the reference current amount $I_{REF}$.

Upon determining which of the time periods T1, T2, T3, T4 the sense amplifier circuit 400 resolved and/or whether and/or how much to adjust the conditioning amount from the initial level, the calibration controller 510 may generate configuration data corresponding to the determination. For some example configurations, the configuration data may indicate a conditioning amount to which the adjustable current source circuitry of the bitline conditioning circuit 420 is to be set. In other example configurations, the configuration data may indicate whether to adjust and/or how much the conditioning amount is to be adjusted from the initial conditioning level. For example, if the initial conditioning amount is the reference current level $I_{REF}$, the configuration data may indicate whether to adjust the reference current amount $I_{REF}$ by the first adjustment amount $\Delta I1$, the second adjustment amount $\Delta I2$, or the third adjustment amount $\Delta I3$ away from the reference current amount $I_{REF}$.

In some example configurations, the configuration data may be an n-bit digital value that uniquely corresponds to time period in which the sense amplifier circuit 400 resolved. For example, since three voltage pulses provide four time periods T1, T2, T3, T4, four two-bit digital values may be used to identify four conditioning amounts or adjustment amounts, each associated with a respective one of the four time periods T1, T2, T3, T4. As non-limiting example, the calibration controller 510 may generate the two-bit value "00" to indicate that the sense amplifier circuit 400 resolved during the first time period T1, the two-bit value "01" to indicate that the sense amplifier circuit 400 resolved during the second time period T2, the two-bit value "10" to indicate that the sense amplifier circuit 400 resolved during the third time period T3, and the two-bit value "11" to indicate that the sense amplifier circuit 400 resolved during the fourth time period T4.

Upon generating the configuration data, the calibration controller 510 may store the configuration data in the sense amp calibration data structure 514 (FIG. 5B). Storing configuration data in the sense amp calibration data structure 514 may mark or identify the end of the first example sense amplifier calibration process. Subsequently, during normal operation, the sense amp operation controller 516 may access the sense amp calibration data structure 514 to identify the configuration data (e.g., the two-bit digital value). In response to identification of the configuration data, the sense amp operation controller 516 may determine a conditioning amount for the cell current $I_{CELL}$ and/or how much to adjust the initial conditioning amount from the initial amount. In addition or alternatively, the configuration data may indicate to the sense amp operation controller 516 how to configure the adjustable current source circuitry of the bitline conditioning circuit 420. For example, the configuration data may indicate whether the fourth current source 424 is to participate in generating the cell current $I_{CELL}$ at the conditioning amount and if so, what adjustment amount the fourth current source 424 is to generate. Upon access of the configuration data, if the sense amp operation controller 516 determines that the fourth current source 424 is not to be involved in generating the cell current $I_{CELL}$ at the conditioning amount, then, when the sense amp operation controller 516 controls the bitline conditioning circuit 420 to generate the cell current $I_{CELL}$ at the conditioning amount just prior to a sense operation, the sense amp operation controller 516 may output the adjustment enable signal $V_{ADJ\_EN}$ at a low voltage level so that the fourth NMOS transistor MN4 is turned off and the fourth current source 424 does not participate in setting the conditioning amount. Alternatively, if upon access of the configuration data, the sense amp operation controller 516 determines that the fourth current source 424 is to be involved in generating the cell current $I_{CELL}$ at the conditioning amount, then, when sense amp operation controller 516 controls the bitline conditioning circuit 420 to generate the cell current $I_{CELL}$ at the conditioning amount just prior to a sense operation, the sense amp operation controller 516 may output the adjustment enable signal $V_{ADJ\_EN}$ at a high voltage level so that the fourth NMOS transistor MN4 is turned on and the fourth current source 424 participates in setting the conditioning amount. The sense amp operation controller 516 may also output the adjustment amount control signal DEL_CTRL at a level that causes the fourth current source 424 to generate the adjustment current $\Delta I_{REF}$ at the adjustment amount indicated by the configuration data.

FIG. 7 shows a flow chart of an example method 700 of performing the first example calibration process. The method is described as being performed with reference to the components shown in FIGS. 4-5B and the timing diagram of FIG. 6. At block 702, the first calibration process may begin. At this time, the calibration controller 510 may output the sense amp enable signal $V_{SA\_EN}$ and the conditioning control signal $V_{EQ}$ so that the bitline 402 and the memory cell 404 are disconnected from node C and the bitline conditioning circuit is connected to node C. Also, the calibration controller 510 may output the adjustment enable signal $V_{ADJ\_EN}$ so that the fourth current source 424 is disconnected from node C and the remaining portion of the bitline conditioning circuit 420 is causing the cell current $I_{CELL}$ to flow at an initial conditioning amount equal to the reference current level $I_{REF}$.

At block 704, the start time $t_{start}$ of the calibration window may occur, at which time the calibration controller 510 may output the sense amp enable signal $V_{SA\_EN}$ to connect the bitline 402 and the memory cell to node C and disconnect the bitline conditioning circuit 420 from node C. The cell current $I_{CELL}$ may begin flowing through the bitline 402 and the memory cell 404. At block 706, the pulse generator 512 may supply a pulse sequence $V_{CP}$ to the response time detection circuit 502. At block 708, the calibration controller 510 may determine the uncalibrated response time of the sense amplifier circuit 400, such as by determining when the sense amplifier circuit 400 resolved relative to the pulse sequence $V_{CP}$. For example, the calibration controller 510 may determine whether the response time detection circuit 502 is generating the resolve signal $V_{RES}$ at a high level or a low level in response to application of a pulse of the pulse sequence to the response time detection circuit 502, as previously described. In addition or alternatively, the calibration controller 510 may determine a time period extending in between the pulses during which the sense amplifier circuit 400 resolved. Also, in some example methods, the pulse generator 512 supplying the pulses of the pulse sequence $V_{CP}$ and the calibrating controller 512 determining when the sense amplifier circuit 400 resolves relative to the pulse sequence $V_{CP}$ may be performed concurrently.

At block 710, the calibration controller 510 may generate configuration data, such as an n-bit digital value, that corresponds to the uncalibrated response time of the sense amplifier circuit 400 and/or when the sense amplifier circuit 400 resolved. The configuration data may indicate what the conditioning amount for the cell current $I_{CELL}$ is to be for subsequent sensing operations following the calibration process. In addition or alternatively, the configuration data may indicate whether and/or how much to adjust the conditioning amount for the cell current $I_{CELL}$ from the reference amount $I_{REF}$. In addition or alternatively, the configuration data may indicate to the sense amp operation controller 516 whether the fourth current source 424 is to be involved in setting the conditioning amount for the cell current $I_{CELL}$, whether to set the level of the adjustment enable signal $V_{ADJ\_EN}$ to turn on or turn off the fourth NMOS transistor MN4, what adjustment amount of current the fourth current source 424 is to generate, and/or what level to set the adjustment amount control signal DEL_CTRL for controlling what amount of current the fourth current source 424 generates. Also at block 710, the calibration controller 510 may include or store the configuration data in the sense amp calibration data structure 514 for subsequent access by the sense amp operation controller 516.

Although the first example calibration process is described with three voltage pulses being generated for the calibration pulse sequence Va., other example embodiments of the first calibration process may use numbers of pulses other than three. In general, at least one pulse may be generated for performance of the first calibration process. For example embodiments where a single voltage pulse is supplied, the calibration controller 510 may determine whether the sense amplifier circuit 400 resolved before or after the voltage pulse is supplied. For such embodiments, the configuration data may be a single bit having a logic 1 value or a logic 0 value. Where two voltage pulses are supplied, the calibration controller 510 may determine whether the sense amplifier circuit 400 resolved before the first pulse, in between the first pulse and the second pulse, or after the second pulse. For such embodiments, the configuration data may be one of three two-bit values. Other example embodiments of the first example calibration process may supply more than three voltage pulses, and the possible configuration data values may correspond to the different time periods resulting from supply of the more than three voltage pulses. Various implementations of the first example calibration process where at least one voltage pulse is supplied during a calibration window may be possible.

Also, for some example configurations of the calibration circuitry, the determination made by the calibration controller 510 may not be an express determination of whether and/or how much to adjust the conditioning amount from the reference level $I_{REF}$. Instead, the calibration controller 510 may determine the uncalibrated response time relative to the pulse sequence $V_{CP}$, and then identify a conditioning amount for the cell current $I_{CELL}$ that corresponds to the determination. The configuration data that the calibration controller 510 generates may indicate the conditioning amount so that the sense amp operation controller 516 sets the bitline conditioning circuit 420 to cause the cell current $I_{CELL}$ to flow at the conditioning amount determined by the calibration controller 510 prior to subsequent sense operations. The configuration of the adjustable current source circuitry of the bitline conditioning circuit 420 may not be limited to the fixed and adjustable current source components 422, 424, shown in FIGS. 4 and 5A, but instead may have any of various kinds of adjustably controllable current source configurations.

Referring to FIG. 8, the second example calibration process may be performed over a plurality of calibration time periods or windows and decision time periods or windows. During a given calibration window, the pulse generator 512 may supply a voltage pulse of a pulse sequence $V_{CP}$, and the calibration controller 510 may be configured to determine a timing relationship between the response time of the sense amplifier circuit 400 and the time that the pulse is supplied. In particular, the calibration controller 510 may determine whether the sense amplifier circuit 400 resolved prior to supply of the pulse. Based on the determination, the calibration controller 510 may determine during an immediately following decision window whether to adjust the conditioning amount of the cell current $I_{CELL}$ that was used just before the immediately prior calibration window. The process may be repeated over the plurality of calibration windows and decision windows. Accordingly, at the start of the second example calibration process, the cell current $I_{CELL}$ may flow at an initial conditioning amount just prior to the start of the first calibration window that provides an initial, uncalibrated response time of the sense amplifier circuit 400. Over the plurality of calibration windows and decision windows, the pulse generator 512 supplies the voltages pulses, the calibration controller 510 determines whether the sense amplifier circuit 400 resolves prior to the supply of the voltages pulses, and determines whether to adjust the conditioning amount based whether the sense amplifier circuit 400 resolves. If adjustments to the conditioning amount are made during the calibration process, the adjustments may move the response time of the sense amplifier circuit 400 from the initial, uncalibrated response time to the desired response time.

In further detail, before each calibration window, the calibration controller 510 may control the sense amplifier circuit 400 to perform a bitline conditioning operation with the cell current $I_{CELL}$ flowing at a certain conditioning level. When a given calibration window is to start, the calibration controller 510 may transition into the given calibration window by outputting the sense amp enable signal $V_{SA\_EN}$ and the conditioning control signal $V_{EQ}$ so that the bitline 402 and the memory cell 404 are connected to node C and the bitline conditioning circuit 420 is disconnected from node C, which causes the sense amplifier circuit 400 to begin performing a sense operation. During the given calibration window, the voltage pulse generator 512 may supply a voltage pulse of a pulse sequence $V_{CP}$ to the response time detection circuit 502. In response to supply of the voltage pulse during the given calibration window, the calibration controller 510 may determine a timing relationship between the response time of the sense amplifier circuit and the voltage pulse supplied during the given calibration window. In particular, the calibration controller 510 may determine whether the sense amplifier circuit 400 resolved prior to supply of the voltage pulse and/or during the given calibration window.

Following the given calibration window, the calibration controller 510 may transition to or enter into a decision window. To make the transition, the calibration controller 510 may output the sense amp enable signal $V_{SA\_EN}$ and the conditioning control signal $V_{EQ}$ so that the bitline 402 and the memory cell 404 are disconnected from node C and the bitline conditioning circuit 420 is connected to node C, which may cause the sense amplifier circuit 400 to begin performing a bitline conditioning operation.

A given calibration window may be associated with a given adjustment amount. During a decision window that follows the given calibration window, the calibration controller 510 may determine whether to adjust a current conditioning amount of the cell current $I_{CELL}$ that was used just before the start of the given calibration window. The determination of whether to adjust may be a determination of whether to adjust by the given adjustment amount associated with the given calibration window. If the calibration controller 510 determines that the sense amplifier circuit 400 did not resolve during the given calibration window, then the calibration controller 510 may determine to adjust the conditioning amount by the given adjustment amount associated with the given calibration window. That is, in response to determining that the sense amplifier circuit 400 did not resolve, the calibration controller 510 may determine that the current conditioning provides too slow of a response time for the sense amplifier circuit 400, and that adjusting the current conditioning amount by the given adjustment amount will move (i.e, increase) the response time of the sense amplifier circuit 400 closer to the desired response time. Alternatively, if the calibration controller 510 determines that the sense amplifier circuit 400 did resolve during the last calibration window, then the calibration controller 510 may determine not to adjust the conditioning amount by the adjustment amount. In other words, the calibration controller 510 may determine that adjusting the current conditioning amount by the associated adjustment amount will not move the response time of the sense amplifier circuit 400 closer to the desired response time.

If calibration controller 510 determines to adjust the current conditioning amount by the associated adjustment amount, then the calibration controller 510 may cause the conditioning amount to be adjusted during the given decision window, such as by outputting the adjustment enable signal $V_{ADJ\_EN}$ and/or the adjustment amount control signal DEL_CTRL at appropriate levels. The calibration controller 510 may then transition and/or enter into a next calibration window, where the pulse generator 512 supplies a next voltage pulse of the calibration pulse sequence $V_{CP}$ and the calibration controller 510 determines whether the sense amplifier circuit 400 resolved prior to supply of the next voltage pulse. The second example calibration process may proceed in this manner until there are no more calibration windows and decision windows.

At the end of the second example calibration process, the calibration controller 510 will have made a series of conditioning current adjustment decisions, and the conditioning level will be at a final level in response to the conditioning current adjustment decisions. In the event that the calibration controller 510 determined not to make any adjustments during the course of the second example calibration process, then the final conditioning level will be the same as the initial conditioning level. However, if the calibration controller 510 determined to make conditioning current adjustments, then the final conditioning level will be different than the initial conditioning level. In the event that one or more conditioning current adjustments are made, the final conditioning level may cause the sense amplifier circuit 400 to have a response time that is at or closer to the desired response time compared to its initial, uncalibrated response time. Accordingly, at the end of the second example calibration process, the calibration controller 510 may generate the configuration data to indicate the final level.

The second example calibration process illustrated with the timing diagram in FIG. 8 shows three voltage pulses supplied within three calibration windows, with a first decision window extending in between the first and second calibration windows, a second decision window extending in between the second and third calibration windows, and a third decision window following the third calibration window. In particular, the first calibration window may extend from an initial or start time $t_{start}$ to a first time $t_1$; the first decision window may extend from the first time $t_1$ to a second time $t_2$; the second calibration window may extend from the second time $t_2$ to a third time $t_3$; the second decision window may extend from the third time $t_3$ to a fourth time $t_4$; the third calibration window may extend from the fourth time to a fifth time $t_5$; and the third decision window may extend from the fifth time $t_5$ to the end time $t_{end}$.

Prior to the start time $t_{start}$, the calibration controller 510 may output the sense amp enable signal $V_{SA\_EN}$ and the conditioning control signal $V_{EQ}$ so that the bitline 402 and the memory cell 404 are disconnected from node C and the bitline conditioning circuit 420 is connected to node C, which may cause the sense amplifier 400 to perform a bitline conditioning operation. During this period, the bitline conditioning circuit 420 may be configured cause the cell current $I_{CELL}$ to a flow at an initial conditioning amount. For some example configurations, the initial conditioning amount may be the reference current $I_{REF}$. The time it takes for the sense amplifier circuit 400 to resolve in response to the cell current $I_{CELL}$ flowing at the initial conditioning amount may be the initial, uncalibrated response time of the sense amplifier circuit 400. The calibration controller 510 may be configured to output the adjustment enable signal $V_{ADJ\_EN}$ and the adjustment amount control signal DEL_CTRL at appropriate levels so that the bitline conditioning circuit 420 causes the cell current $I_{CELL}$ to flow at the initial conditioning amount.

The start time $t_{start}$ may then occur, and the calibration controller 510 may transition to the first calibration window by outputting the sense amp enable signal $V_{SA\_EN}$ and the conditioning control signal $V_{EQ}$ at levels to connect the bitline 402 and the memory cell 404 to node C and to disconnect the bitline conditioning circuit 420 from node C, which may cause the sense amplifier to begin performing a sense operation. During the first calibration window, the cell current $I_{CELL}$ may begin to flow through the bitline 402 and the memory cell 404. Also, after a first predetermined time period T1 elapses from the start of the first calibration window (i.e., the start time $t_{start}$), the pulse generator 512 may supply the first pulse of the pulse sequence $V_{CP}$. In response to supplying the first pulse, the calibration controller 510 may determine if the sense amplifier circuit 400 resolved, such as by detecting whether the resolve voltage $V_{RES}$ at node OUT_C is at a high level, as previously described. In this context, for the second example calibration process, the determination or measurement of a response time of the sense amplifier circuit 400 made by the calibration controller 510 may be a determination of whether the sense amplifier circuit 400 resolved prior to or during supply of a voltage pulse of the pulse sequence during a respective calibration window.

At time $t_1$ the first calibration window may end and the calibration controller 510 may transition to the first decision window, such as by outputting the sense amp enable signal $V_{SA\_EN}$ and the conditioning control signal $V_{EQ}$ at levels to disconnect the bitline 402 and the memory cell 404 from node C and reconnect the bitline conditioning circuit 420 to node C, which may cause the sense amplifier circuit 400 to perform a bitline conditioning operation. Within the first decision window, the calibration controller 510 may determine whether to adjust the conditioning amount by a first adjustment amount $\Delta I1$ associated with the first calibration window from the amount prior to the start of the first calibration window—i.e., the initial conditioning amount. In particular, if the calibration controller 510 determines that the sense amplifier circuit 400 did not resolve before the first pulse, then the calibration controller 510 may determine to adjust the conditioning amount by the first adjustment amount $\Delta I1$. Alternatively, if the calibration controller 510 determines that the sense amplifier circuit 400 resolved before the first pulse, then the calibration controller 510 may determine to not adjust the conditioning amount—i.e., keep the conditioning amount as is.

Referring back to FIG. 5A, a ninth NMOS transistor MN9 may be coupled to the output node OUT_C of the response time detection circuit 502. The ninth NMOS transistor MN9 may function as a reset or discharge circuit. When turned on, the ninth NMOS transistor MN9 may lower or pull down the voltage at the output node OUT_C to ground GND or otherwise reset the resolve signal $V_{RES}$ to a low level in response to a reset signal $V_{RST}$ output by the calibration controller 510. During a calibration window, the reset transistor MN9 may be turned off to that it does not affect the voltage level of the resolve signal $V_{RES}$. If, during a calibration window, the sense amplifier circuit 400 resolves and the resolve signal $V_{RES}$ is generated at the high voltage level at the output node OUT_C, the cross-coupled inverters 504, 506 may function as a latch and hold the voltage at node OUT_C at the high voltage level. However, when entering a next calibration window, the calibration controller 510 may again determine whether the sense amplifier circuit 400 resolved, this time with respect to the next pulse supplied during the next calibration window. In order for the calibration controller 510 to make the determination, the calibration controller 510 may output the reset signal $V_{RST}$ to reset the transistor MN9 in order to reset the resolve signal $V_{RES}$ and bring down the voltage level at node OUT_C to a low level (e.g., to ground GND) for the start of the next calibration window.

Referring back to FIG. 8, during the first decision window before transitioning to the second calibration window, and provided that the calibration controller 510 has determined whether the sense amplifier circuit 400 has resolved with respect to the first pulse, the calibration controller 510 may output the reset signal $V_{RST}$ to turn on the ninth NMOS transistor MN9 to reset the resolve signal $V_{RES}$ and pull down the voltage level at the output node OUT_C to a low level. For some example configurations, the calibration controller 510 may reset the voltage level on the output node OUT_C regardless of whether the sense amplifier circuit 400 resolved during the first calibration window. For other example configurations, the calibration controller 510 may reset the voltage level on the output node OUT_C only in the event that the sense amplifier circuit 400 resolved and the resolve signal $V_{RES}$ is at the high voltage level at the output node OUT_C. If the calibration controller 510 determines to reset the voltage level on the output node OUT_C, the calibration controller 510 may turn on the ninth NMOS transistor MN9 to keep the output node OUT_C pulled down until the second calibration window begins at the second time $t_2$. At that time $t_2$, the calibration controller 510 may output the reset signal $V_{RST}$ at a level to turn off the ninth NMOS transistor MN9.

At the second time $t_2$, the calibration controller 510 may exit the first decision window and enter the second calibration window. The calibration controller 510 may operate similarly as it did before with respect to the first calibration and decision window. At the second time $t_2$, the calibration controller 510 may transition to the second calibration window by outputting the sense amp enable signal $V_{SA\_EN}$ and the conditioning control signal $V_{EQ}$ at levels to connect the bitline 402 and the memory cell 404 to node C and to disconnect the bitline conditioning circuit 420 from node C, which may cause the sense amplifier circuit 400 to perform a sense operation. During the second calibration window, the cell current $I_{CELL}$ may begin to flow through the bitline 402 and the memory cell 404. Also, after a second predetermined time period T2 elapses from the start of the second calibration window (i.e., the second time $t_2$), the pulse generator 512 may supply the second pulse of the pulse sequence $V_{CP}$. In response to supplying the second pulse, the calibration controller 510 may determine if the sense amplifier circuit 400 resolved, such as by detecting whether the resolve voltage $V_{RES}$ at node OUT_C is at a high level, as previously described.

At the third time $t_3$ the second calibration window may end and the calibration controller 510 may transition to the second decision window, such as by outputting the sense amp enable signal $V_{SA\_EN}$ and the conditioning control signal $V_{EQ}$ at levels to disconnect the bitline 402 and the memory cell 404 from node C and reconnect the bitline conditioning circuit 420 to node C, which may cause the sense amplifier circuit 400 to begin performing a bitline conditioning operation. Within the second decision window, the calibration controller 510 may determine whether to adjust the conditioning amount by a second adjustment amount ΔI2 associated with the second calibration window from the amount prior to the start of the second calibration window. In particular, if the calibration controller 510 determines that the sense amplifier circuit 400 did not resolve before the second pulse, then the calibration controller 510 may determine to adjust the conditioning amount by the second adjustment amount ΔI2. Alternatively, if the calibration controller 510 determines that the sense amplifier circuit 400 resolved before the second pulse, then the calibration controller 510 may determine to not adjust the conditioning amount—i.e., keep the conditioning amount as is.

In addition, during the second decision window before transitioning to the third calibration window, and provided that the calibration controller 510 determined whether the sense amplifier circuit 400 has resolved with respect to the second pulse, the calibration controller 510 may output the reset signal $V_{RST}$ to turn on the ninth NMOS transistor MN9 to reset the resolve signal $V_{RES}$ and pull down the voltage level at the output node OUT_C to a low level. If the calibration controller 510 determines to reset the voltage level on the output node OUT_C, the calibration controller 510 may turn on the ninth NMOS transistor MN9 to keep the output node OUT_C pulled down until the third calibration window begins at the fourth time $t_2$. At that time $t_4$, the calibration controller 510 may output the reset signal $V_{RST}$ at a level to turn off the ninth NMOS transistor MN9.

At the fourth time $t_4$, the calibration controller 510 may exit the second decision window and enter the third calibration window. The calibration controller 510 may operate similarly as it did before with respect to the first and second calibration and decision windows. At the fourth time $t_4$, the calibration controller 510 may transition to the third calibration window by outputting the sense amp enable signal $V_{SA\_EN}$ and the conditioning control signal $V_{EQ}$ at levels to connect the bitline 402 and the memory cell 404 to node C and to disconnect the bitline conditioning circuit 420 from node C, which may cause the sense amplifier circuit 400 to begin performing a sense operation. During the third calibration window, the cell current $I_{CELL}$ may begin to flow through the bitline 402 and the memory cell 404. Also, after a third predetermined time period T3 elapses from the start of the third calibration window (i.e., the fourth time $t_4$), the pulse generator 512 may supply the third pulse of the pulse sequence $V_{CP}$. In response to supplying the third pulse, the calibration controller 510 may determine if the sense amplifier circuit 400 resolved, such as by detecting whether the resolve voltage $V_{RES}$ at node OUT_C is at a high level, as previously described.

At the fifth time is the third calibration window may end and the calibration controller 510 may transition to the third decision window, such as by outputting the sense amp enable signal $V_{SA\_EN}$ and the conditioning control signal $V_{EQ}$ at levels to disconnect the bitline 402 and the memory cell 404 from node C and reconnect the bitline conditioning circuit 420 to node C, which may cause the sense amplifier circuit 400 to begin performing a bitline conditioning operation. Within the third decision window, the calibration controller 510 may determine whether to adjust the conditioning amount by a third adjustment amount ΔI3 associated with the third calibration window from the amount prior to the start of the third calibration window. In particular, if the calibration controller 510 determines that the sense amplifier circuit 400 did not resolve before the third pulse, then the calibration controller 510 may determine to adjust the conditioning amount by the third adjustment amount ΔI3. Alternatively, if the calibration controller 510 determines that the sense amplifier circuit 400 resolved before the third pulse, then the calibration controller 510 may determine to not adjust the conditioning amount—i.e., keep the conditioning amount as is.

At the end time $t_{end}$ at the end of the third decision window, the second example calibration process may end. In some example configurations, the calibration controller 510 may output the reset signal $V_{RST}$ to turn on the ninth NMOS transistor MN9 to reset the resolve signal $V_{RES}$ and pull down the voltage level at the output node OUT_C to a low level during the third decision window before the end of the second example calibration process.

At the end of the second example calibration process, or alternatively as part of the third (e.g., last) decision window of the second example calibration process, the calibration controller 510 may generate the configuration data. The calibration data may indicate the final conditioning amount resulting of the series of conditioning current adjustment decisions that the calibration controller 510 made during the decision windows. In addition or alternatively, the configuration data may identify whether the conditioning amount was adjusted for each calibration window and/or decision window. In some example configurations, the configuration data may be an n-bit digital value, with each bit identifying whether the conditioning amount was adjusted during an associated decision window. For these configurations, the number n may be equal to the number of decision windows. To illustrate, since the second example calibration process described with reference to FIG. 8 utilized three configuration windows and three decision windows, the configuration data may be a 3-bit digital value, with each bit value associated with a respective decision window and indicating whether the conditioning current was adjusted by the adjustment amount associated with the respective decision window. For example, a bit value of a first bit may indicate whether the conditioning current was adjusted by the first adjustment amount ΔI1 during the first decision window, a bit value of a second bit may indicate whether the conditioning current was adjusted by the second adjustment amount ΔI2 during the second decision window, and a bit value of a third bit may indicate whether the conditioning current was adjusted by the third adjustment amount ΔI3 during the third decision window.

Utilizing three pulses and three calibration and decision windows may result in the final conditioning current determined at the end of the second example calibration process to be one of eight possible conditioning currents. The configuration data, regardless of its particular format, may indicate which of the eight possible conditioning currents that the calibration controller 510 determined.

Upon generating the configuration data, the calibration controller 510 may store the configuration data in the sense amp calibration data structure 514, as previously described. Subsequently, the sense amp operation controller 516 may access the configuration data to generate the adjustment enable $V_{ADJ}$ and the adjustment amount control signals DEL_CTRL at appropriate levels so that just before the sense amplifier circuit 400 performs a sense operation, the cell current $I_{CELL}$ flows at the conditioning amount determined by the calibration controller 510 during the second example calibration process.

In addition, as previously described, the pulse generator 512 may supply the first, second, and third pulses in response to expiration of respective time periods T1, T2, T3 following the start of their respective calibration windows. For some example configurations, the time periods T1, T2, T3 may vary. In particular example configurations, the first time period T1 may be the longest, the third (last) time period T3 may be the shortest, and the second time period T2 may be in between the first and third time periods T1, T3, or mathematically: T3<T2<T1. For these configurations where the time periods become increasingly shorter for subsequent calibration windows, the adjustments in the conditioning current may become finer in granularity. For example, if the calibration controller 510 determines to adjust by the first adjustment amount ΔI1 following the first calibration window, the adjustment may be considered a coarse adjustment; if the calibration controller 510 determines to adjust by the second adjustment amount ΔI2 following the second calibration window, the adjustment may be considered an intermediate adjustment, and if the calibration controller 510 determines to adjust by the third adjustment amount ΔI3 following the third calibration window, the adjustment may be considered a fine adjustment. For these example configurations, the amount of the adjustments may decrease as the time periods shorten. That is, the first adjustment amount ΔI1 may be the largest adjustment amount corresponding to the longest time period T1, the third adjustment amount ΔI3 may be the smallest adjustment amount corresponding to the shortest time period T3, and the second adjustment amount ΔI2 may be in between the first and third adjustment amounts ΔI1, ΔI3 to correspond to the time period T2 in between the shortest and longest time periods T1, T3.

FIG. 9 shows a flow chart of an example method 900 of performing the second example calibration process. The method is described as being performed with reference to the components shown in FIGS. 4-5B and the timing diagram of FIG. 8. At block 902, the calibration process may begin at a time just before the first calibration window starts. At this time, the calibration controller 510 may output the sense amp enable signal $V_{SA\_EN}$ and the conditioning control signal $V_{EQ}$ so that the bitline 402 and the memory cell 404 are disconnected from node C and the bitline conditioning circuit 420 is connected to node C and the cell current $I_{CELL}$ is flowing at an initial conditioning amount, such as the reference amount $I_{REF}$. The calibration controller 510 may output the adjustment enable signal $V_{ADJ\_EN}$ and the adjustment amount control signal DEL_CTRL so that the bitline conditioning circuit 420 is causing the cell current $I_{CELL}$ to flow at the initial conditioning amount.

At block 904, the calibration controller 510 may transition to the first calibration window, at which time the calibration controller 510 may output the sense amp enable signal $V_{SA\_EN}$ and the conditioning control signal $V_{EQ}$ to connect the bitline 402 and the memory cell 404 to node C and disconnect the bitline conditioning circuit 420 from node C, which may cause the sense amplifier circuit to begin performing a sense operation. At block 906, the pulse generator 512 may generate and supply a first pulse of a pulse sequence to the response time detection circuit 502 upon expiration of a first time period T1 beginning at the start of the first calibration window. In addition, at block 906, the calibration controller 510 may identify whether the sense amplifier circuit 400 resolved in response to supply of the first pulse.

At block 908, the first calibration window may end, and the calibration controller 510 may transition to a first decision window, such as by outputting the sense amp enable signal $V_{SA\_EN}$ and the conditioning control signal $V_{EQ}$ to disconnect the bitline 402 and the memory cell 404 from node C and to connect the bitline conditioning circuit 420 to node C, which may cause the sense amplifier circuit 400 to begin performing a bitline conditioning operation. During the first decision window, the calibration controller 510 may determine whether to adjust the conditioning amount by the first adjustment amount ΔI1. In particular, if the calibration controller 510 determined that the sense amplifier circuit 400 did not resolve during the first calibration window before the first pulse, then the calibration controller 510 may determine to adjust the conditioning amount by the first adjustment amount ΔI1. Alternatively, if the calibration controller 510 determined that the sense amplifier circuit 400 resolved during the first calibration window before the first pulse, then the calibration controller 510 may determine not to adjust the conditioning amount. If the calibration controller 510 determines to adjust the conditioning amount by the first adjustment amount ΔI1, then the calibration controller 510 may do so during the first decision window, such as by changing the adjustment amount control signal DEL_CTRL output to the fourth current source 424 so that the fourth current source 424 changes the conditioning current amount by the first adjustment amount ΔI1. Also, during the first decision window, the calibration controller 510 may turn on the reset transistor MN9 to pull down the voltage at the output node OUT_C to a low level.

At block 910, the calibration controller 510 may transition to the second calibration window, at which time the calibration controller 510 may output the sense amp enable signal $V_{SA\_EN}$ and the conditioning control signal $V_{EQ}$ to connect the bitline 402 and the memory cell 404 to node C and disconnect the bitline conditioning circuit 420 from node C, which may cause the sense amplifier circuit 400 to begin performing a sense operation. At block 912, the pulse generator 512 may generate and supply a second pulse of the pulse sequence to the response time detection circuit 502 upon expiration of a second time period T2 beginning at the start of the second calibration window. In addition, at block 912, the calibration controller 510 may identify whether the sense amplifier circuit 400 resolved in response to supply of the second pulse.

At block 914, the second calibration window may end, and the calibration controller 510 may transition to a second decision window, such as by outputting the sense amp enable signal $V_{SA\_EN}$ and the conditioning control signal $V_{EQ}$ to disconnect the bitline 402 and the memory cell 404 from node C and to connect the bitline conditioning circuit 420 to node C, which may cause the sense amplifier circuit 400 to begin performing a bitline conditioning operation. During the second decision window, the calibration controller 510 may determine whether to adjust the conditioning amount by the second adjustment amount ΔI2 In particular, if the calibration controller 510 determined that the sense amplifier circuit 400 did not resolve during the second calibration window before the second pulse, then the calibration controller 510 may determine to adjust the conditioning amount by the second adjustment amount ΔI2. Alternatively, if the calibration controller 510 determined that the sense amplifier circuit 400 resolved during the second calibration window before the second pulse, then the calibration controller 510 may determine not to adjust the conditioning amount. If the calibration controller 510 determines to adjust the conditioning amount by the second adjustment amount ΔI2, then the calibration controller 510 may do so during the second decision window, such as by changing the adjustment amount control signal DEL_CTRL output to the fourth current source 424 so that the fourth current source 424 changes the conditioning current amount by the second adjustment amount ΔI2 Also, during the second decision window, the calibration controller 510 may turn on the reset transistor MN9 to pull down the voltage at the output node OUT_C to a low level.

At block 916, the calibration controller 510 may transition to the third calibration window, at which time the calibration controller 510 may output the sense amp enable signal $V_{SA\_EN}$ and the conditioning control signal $V_{EQ}$ to connect the bitline 402 and the memory cell 404 to node C and disconnect the bitline conditioning circuit 420 from node C, which may cause the sense amplifier circuit 400 to begin performing a sense operation. At block 918, the pulse generator 512 may generate and supply a third pulse of the pulse sequence to the response time detection circuit 502 upon expiration of a third time period T3 beginning at the start of the third calibration window. In addition, at block 918, the calibration controller 510 may identify whether the sense amplifier circuit 400 resolved in response to supply of the third pulse.

At block 920, the third calibration window may end, and the calibration controller 510 may transition to a third decision window, such as by outputting the sense amp enable signal $V_{SA\_EN}$ and the conditioning control signal $V_{EQ}$ to disconnect the bitline 402 and the memory cell 404 from node C and to connect the bitline conditioning circuit 420 to node C, which may cause the sense amplifier circuit 400 to begin performing a bitline conditioning operation. During the third decision window, the calibration controller 510 may determine whether to adjust the conditioning amount by the third adjustment amount ΔI3. In particular, if the calibration controller 510 determined that the sense amplifier circuit 400 did not resolve during the third calibration window before the third pulse, then the calibration controller 510 may determine to adjust the conditioning amount by the third adjustment amount ΔI3. Alternatively, if the calibration controller 510 determined that the sense amplifier circuit 400 resolved during the third calibration window before the third pulse, then the calibration controller 510 may determine not to adjust the conditioning amount. If the calibration controller 510 determines to adjust the conditioning amount by the third adjustment amount ΔI3, then the calibration controller 510 may do so during the third decision window, such as by changing the adjustment amount control signal DEL_CTRL output to the fourth current source 424 so that the fourth current source 424 changes the conditioning current amount by the third adjustment amount ΔI3. Also, during the third decision window, the calibration controller 510 may turn on the reset transistor MN9 to pull down the voltage at the output node OUT_C to a low level.

At block 922, there may be no further calibration windows or pulses of the pulse sequence to generate and the calibration controller 510 may generate the configuration data. As previously described, the configuration may indicate whether the calibration controller 510 adjusted and/or determined to adjust the conditioning current by the first, second, and third amounts ΔI1, ΔI2, ΔI3 during each of the first, second, and third decision windows, respectively. Also, at block 922, the calibration controller may store the configuration data in the sense amp calibration data structure 914, as previously described.

In addition, although the second example calibration process is described with reference to three voltage pulses generated in three respective calibration windows, other example embodiment of the second calibration process may supply more or fewer than three voltage pulses in more or fewer than three calibration windows. For example, two voltage pulses may be supplied during two respective calibration windows, resulting in four different possible conditioning amounts determined at the end of the calibration process. Similarly, four voltage pulses may be supplied during four respective calibration windows, resulting in sixteen different possible conditioning amounts determined at the end of the calibration process.

Also, although the second example calibration process is described with reference to a single voltage pulse supplied in a single calibration window, other example embodiments may include supplying multiple voltage pulses within a single calibration window. During a subsequent decision window, the calibration controller 102 may determine whether and/or how much to adjust the conditioning amount based on whether the sense amplifier circuit 400 resolved with respect to the multiple pulses. Such embodiments may be a combination of the first and second calibration processes. Additionally, the adjustment amounts associated with each of the calibration windows may be positive values, negative values, or a combination thereof. In general, the second calibration process may be implemented as an iterative process with a predetermined number or an indefinite or infinite number of calibration windows followed by decision windows. During the decision windows, the conditioning current may be adjusted—by increasing and/or decreasing the conditioning current—in various degrees of coarse and fine adjustments until the response time of the sense amplifier circuit 400 is determined to be at a desired or acceptable time and/or within a desired or acceptable response time range. Various ways of implementing the second example calibration process as an iterative process may be possible.

Lastly, although the sense amplifier calibration processes are described with reference to two-terminal or resistive memory cells, the sense amplifier calibration processes can be used for any suitable type of memory technology. Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in they direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the preferred embodiments described herein can be used alone or in combination with one another.

We claim:

1. A circuit comprising:
a calibration controller configured to generate configuration data based on a response time of a sense amplifier circuit; and
a sense amplifier operation controller configured to set a conditioning level of a conditioning current for the sense amplifier circuit according to the configuration data.

2. The circuit of claim 1, wherein the configuration data indicates an amount to adjust the conditioning current from an initial conditioning level.

3. The circuit of claim 1, wherein the calibration controller is further configured to:
measure a timing relationship between the response time and a pulse sequence; and
generate the configuration data according to the timing relationship.

4. The circuit of claim 3, wherein the calibration controller is configured to determine when the sense amplifier circuit resolves relative to the pulse sequence to measure the timing relationship.

5. The circuit of claim 4, further comprising:
a pulse generator configured to supply the pulse sequence to a detection circuit,
wherein the calibration controller circuit is configured to measure a level of an output signal of the detection circuit to determine when the sense amplifier resolves relative to one or more pulses of the pulses sequence.

6. The circuit of claim 3, further comprising:
a pulse generator configured to supply the pulse sequence within a single calibration window,
wherein the calibration controller is configured to determine the timing relationship between the response time and the pulse sequence within the single calibration window.

7. The circuit of claim 3, wherein the pulse sequence comprises a plurality of pulses, the circuit further comprising:
a pulse generator configured to supply a respective one of the plurality of pulses in each of a plurality of calibration windows,
wherein the calibration controller is configured to determine whether the sense amplifier resolves during each of the plurality of calibration windows.

8. The circuit of claim 7, wherein the calibration controller is configured to determine whether to adjust the conditioning level after each of the plurality of calibration windows, and wherein each determination of whether to adjust is based on whether the calibration controller determined that the sense amplifier resolved during a prior one of the plurality of calibration windows.

9. The circuit of claim 8, wherein the calibration controller is configured to determine whether to adjust the conditioning current by different conditioning amounts, wherein each conditioning amount is associated with a respective one of the calibration windows.

10. The circuit of claim 7, wherein for each of the plurality of calibration windows, the pulse generator is configured to supply a pulse in a respective calibration window upon expiration of a respective one of a plurality of time periods, and wherein the time periods are increasingly shorter over consecutive calibration windows.

11. A circuit comprising:
a calibration controller configure to:
determine a response time characterization of a sense amplifier circuit relative to a pulse sequence;
in response to the measurement, determine an amount to adjust an initial conditioning level of a cell current in order for the sense amplifier circuit to have a desired response time; and
store configuration data that indicates the amount to adjust.

12. The circuit of claim 11, further comprising:
a sense amplifier operation controller configured to:
access the configuration data; and
configure a bitline conditioning circuit to generate the cell current at a conditioning level corresponding to the configuration data.

13. The circuit of claim 11, further comprising:
a pulse generator configured to supply the pulse sequence to a detection circuit,
wherein the calibration controller is configured to determine a level of an output signal of the detection circuit to determine the response time characterization.

14. The circuit of claim 11, further comprising:
a pulse generator configured to supply the pulse sequence within a single calibration window,
wherein the calibration controller is configured to generate the configuration data according to a measured timing relationship between an uncalibrated response time of the sense amplifier circuit and the pulse sequence within the single calibration window.

15. The circuit of claim 11, wherein the pulse sequence comprises a plurality of pulses, the circuit further comprising:

a pulse generator configured to supply a respective one of the plurality of pulses in each of a plurality of calibration windows, wherein the calibration controller is configured to determine whether the sense amplifier circuit resolves during each of the plurality of calibration windows.

16. The circuit of claim 15, wherein the calibration controller is further configured to determine whether to adjust the conditioning level after each of the plurality of calibration windows, and wherein each determination of whether to adjust is based on whether the calibration controller determined that the sense amplifier circuit resolved during a prior one of the plurality of calibration windows.

17. The circuit of claim 11, wherein the calibration controller is configured to adjust a conditioning level of the cell current multiple times before generating the configuration data.

18. A system comprising:
a sense amplifier circuit configured to resolve a logic level of data stored in a memory cell;
a pulse generator configured to supply a pulse sequence;
a response time detection circuit configured to output a resolve signal indicative of whether the sense amplifier resolves the logic level in response to receipt of the pulse sequence;
a calibration controller configured to:
measure when the sense amplifier circuit resolves relative to the pulse sequence; and
generate configuration data based on the measurement; and
a sense amplifier operation controller configured to set a bitline conditioning circuit according to the configuration data.

19. The circuit of claim 18, wherein the detection circuit comprises:
a pair of transistor branches configured to receive the output of the sense amplifier and the pulse sequence; and
a latch circuit configured to generate the resolve signal.

20. The circuit of claim 19, wherein a transistor in each of the pair of transistor branches is configured to receive the pulse sequence.

* * * * *